United States Patent
Miyazaki et al.

(10) Patent No.: US 8,495,463 B2
(45) Date of Patent: Jul. 23, 2013

(54) MEMORY CONTROLLING APPARATUS AND METHOD

(75) Inventors: Sadao Miyazaki, Kawasaki (JP); Osamu Ishibashi, Kawasaki (JP); Rikizo Nakano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 654 days.

(21) Appl. No.: 12/725,893

(22) Filed: Mar. 17, 2010

(65) Prior Publication Data
US 2010/0251041 A1    Sep. 30, 2010

(30) Foreign Application Priority Data
Mar. 31, 2009 (JP) .................. 2009-88381

(51) Int. Cl.
*G11C 29/00* (2006.01)
(52) U.S. Cl.
USPC .......................... 714/763; 714/719
(58) Field of Classification Search
USPC ........ 360/53; 369/53.15, 275.3, 47.14; 714/6, 714/718, 710, 763, 719
See application file for complete search history.

(56) References Cited

U.S. PATENT DOCUMENTS

| 4,214,280 A * | 7/1980 | Halfhill et al. .................. 360/53 |
| 5,315,552 A | 5/1994 | Yoneda |
| 7,821,894 B2 * | 10/2010 | Shimma ..................... 369/53.15 |
| 7,944,805 B2 * | 5/2011 | Hwang et al. .............. 369/275.3 |
| 8,045,430 B2 * | 10/2011 | Park et al. .................. 369/47.14 |
| 2008/0270826 A1 * | 10/2008 | Shaw et al. ....................... 714/6 |

FOREIGN PATENT DOCUMENTS

| JP | 5-53926 A | 3/1993 |
| JP | 05-158804 A | 6/1993 |
| JP | 2001-006388 A | 1/2001 |
| JP | 2004055100 A | 2/2004 |
| JP | 2006-065396 A | 3/2006 |
| JP | 2006-107363 A | 4/2006 |

OTHER PUBLICATIONS

Notification of Reason for Refusal dated May 28, 2013 corresponding to Japanese Patent Application No. 2009-088381 and English translation thereof.

* cited by examiner

*Primary Examiner* — David Ton
(74) *Attorney, Agent, or Firm* — Squire Sanders (US) LLP

(57) ABSTRACT

A memory control device is provided. The memory control device is configured to control access to a storage device including a plurality of storage areas. The memory control device includes a defect detecting unit configured to detect a defective area of a storage area into which data may not be stored. The memory control device also includes a storage processing unit configured to store defect information including address information of the defective area detected using the defect detecting unit into a memory area. A data writing unit is also included in the memory control device. The data writing unit is configured to write data, which has been written into the defective area, into a storage area other than the storage area comprising the defective area based on the defect information stored using the storage processing unit.

18 Claims, 19 Drawing Sheets

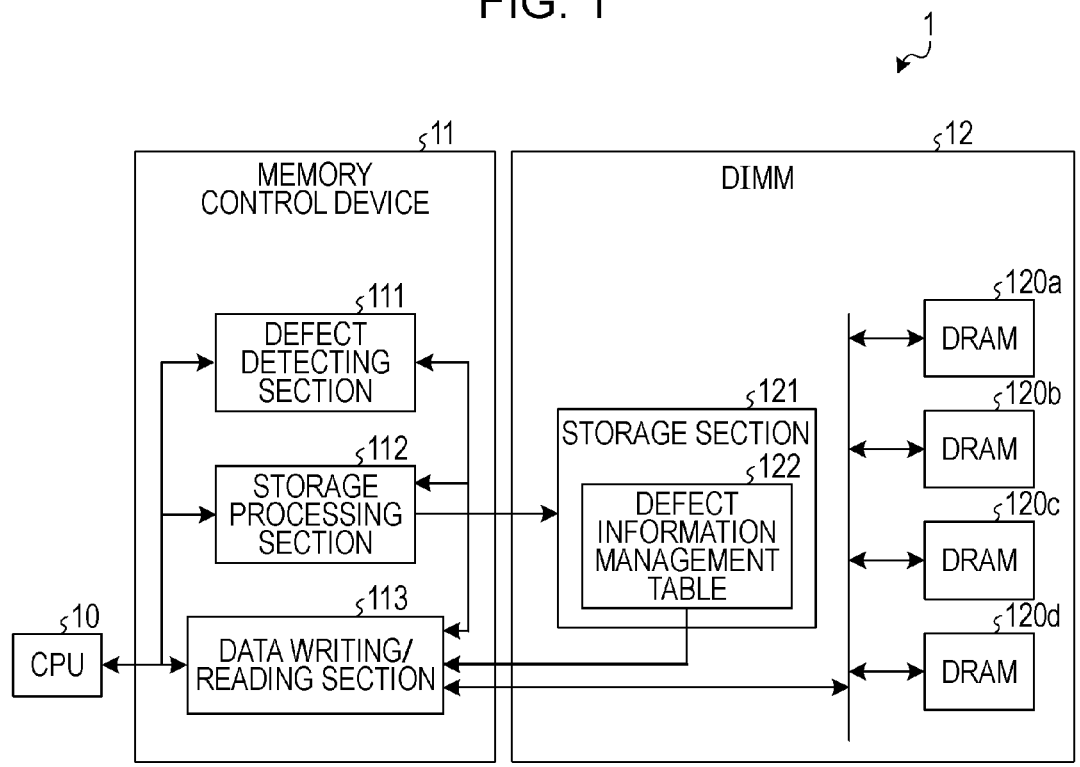

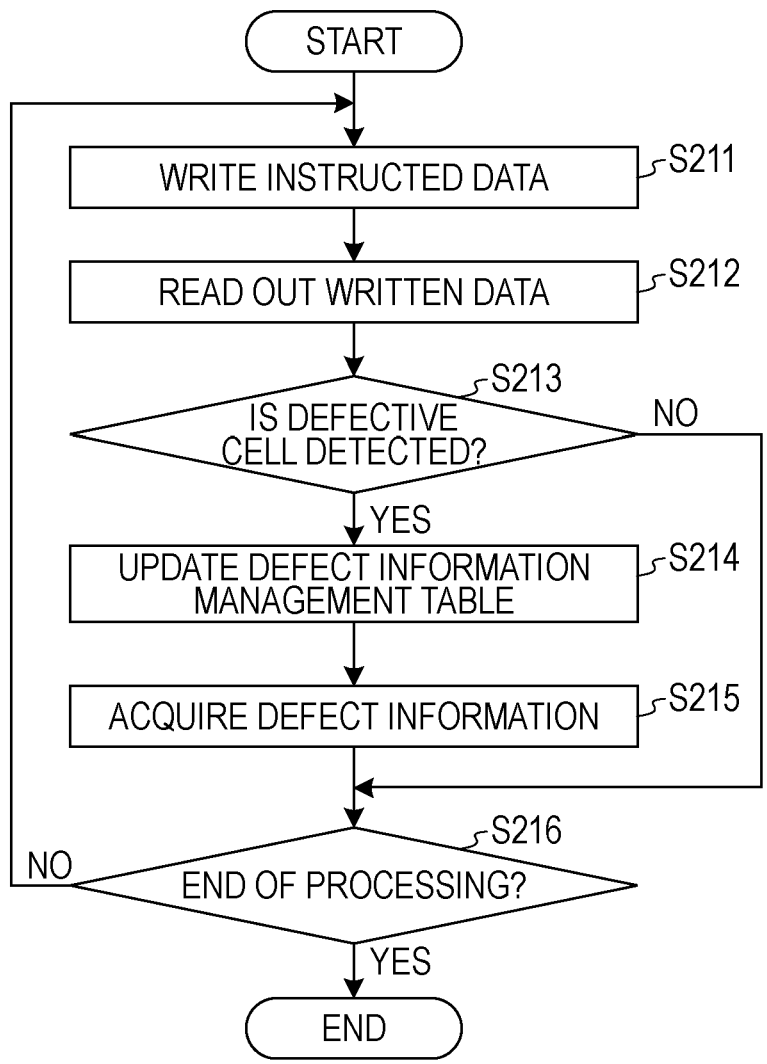

MEMORY CONTROLLING APPARATUS AND METHOD

CROSS-REFERENCE TO RELATED APPLICATION

This application is based upon and claims the benefit of priority of the prior Japanese Patent Application No. 2009-88381, filed on Mar. 31, 2009, the entire contents of which are incorporated herein by reference.

FIELD

The embodiments discussed herein are related to a memory control device, a memory module, and a memory controlling method.

BACKGROUND

A memory module, such as a DIMM (Dual Inline Memory Module), constituting a main memory of an information processing apparatus is installed on an information processing apparatus, such as a personal computer. For example, as illustrated in FIG. 10A, an information processing apparatus 500 includes a CPU (Central Processing Unit) 510, a chip set 520, and a DIMM 530.

The CPU 510 is an arithmetic processing device for performing data calculation and processing and is configured to instruct the chip set 520 to write data into the DIMM 530 and to read data out of the DIMM 530. The chip set 520 is a memory control device connected to the DIMM 530 and performs data writing into the DIMM 530 and data reading out of the DIMM 530 based on an instruction given from the CPU 510. The DIMM 530 includes a plurality of DRAMs (Dynamic Random Access Memories) 531a to 531d, whereby various pieces of data are stored in the DRAMs 531a to 531d.

If a memory error occurs in the DIMM 530, while the information processing apparatus as described above is in operation, the operation of the information processing apparatus may be temporarily stopped to replace the DIMM 530 that has failed with a new DIMM 530, burdening the user of the information processing apparatus. The memory error is induced by generation of a defective block (i.e., a defective area). The memory error prevents data from being stored in affected memory blocks (storage areas) that are installed in the DRAMS 531a to 531d.

FIG. 11 illustrates an example of a process to be performed when a memory error occurs in a DIMM. As illustrated in FIG. 11, when a power source is turned on, the chip set 520 starts to monitor defect occurring statuses in the DRAMs 531a to 531d (step S501). The chip set 520 determines whether a defect occurrence in any one of the DRAMs 531a to 531d has been detected (step S502). In this process, when an error occurrence in any one of the DRAMs 531a to 531d is not detected ("No" at step S502), the process returns to step S501 and the chip set 520 continues to monitor the defect occurring statuses in the DRAMs 531a to 531d. When the chip set 520 determines that a defect occurrence in any one of the DRAMs 531a to 531d has been detected ("Yes" at step S502), the chip set 520 saves defect information (step S503) and then turns the power source off (step S504) to terminate the process. The DIMM 530, which has been determined to be defective, is replaced with a new DIMM 530.

Respective pieces of defect information of the respective DRAMs 531a to 531d are gathered together and stored in a nonvolatile memory 532 installed in the DIMM 530, as illustrated in FIG. 10A. As an alternative, the defect information of the respective DRAMs 531a to 531d may be discretely stored in nonvolatile memory areas 533a to 533d installed in the respective DRAMs 531a to 531d, as illustrated in FIG. 10B.

As described above, it may be difficult to utilize the DIMM even when there is only one defective block present in the DIMM. A technique of utilizing a redundant area prepared in a DRAM as an alternative area for the defective block has been used to utilize the DIMM having the defective block.

An example of the previously discussed technique is illustrated in FIG. 12. As illustrated in FIG. 12, an information processing apparatus 600 includes a CPU 610, a chip set 620, and a DIMM 630. DRAMs 631a to 631d in the DIMM 630 include redundant areas 632a to 632d, respectively. A nonvolatile memory 633 for storing defect information of the DRAMs 631a to 631d is installed in the DIMM 630. The nonvolatile memory 633 stores defect information about a defective block that has been detected in an electrical test performed before shipment of the information processing apparatus 600.

FIG. 13A illustrates an example of a process performed when a memory error has been detected in an electrical test. As illustrated in FIG. 13A, when the electrical test is started, a process of detecting a defective block included in any one of the DRAMs 631a to 631d is performed (step S601). When the defective block is detected in the process ("Yes" at step S602), defect information is saved (step S603). The defective block, which has been detected by the detecting process performed at step S601, is repaired in hardware, whereby data, whose writing into the defective block has been instructed, is written into a redundant area (step S604). At the completion of this process, or when a defective block has not been detected ("No" at step S602), the electrical test of the DIMM 630 is terminated.

Next, FIG. 13B illustrates an example of a process to be performed when access to a defective block has been instructed while the information processing apparatus is in operation. As illustrated in FIG. 13B, when the power source of the information processing apparatus 600 is turned on, the chip set 620 expands the defect information stored in the nonvolatile memory 633 onto the respective DRAMs 631a to 631d (step S611) and then determines whether access to the defective block has been instructed from the CPU 610 (step S612). When it is determined that access to the defective block has been instructed ("Yes" at step S612), the chip set 620 gains access to the redundant areas 632a to 632d (step S613) instead of gaining access to the defective block. Hence, when data is written into a defective block as instructed from the CPU 610, the chip set 620 operates to write data into the redundant areas 632a to 632d instead of the defective block.

When the process at step S613 is completed or no further instructions have been given from the CPU 610 to access the defective block at step S612 ("No" at step S612), the chip set 620 determines whether the power source has been turned off (step S614). If the power source is not turned off ("No" at step S614), the chip set 620 returns the process to step S612. If the chip set 620 determines that the power source has been turned off ("Yes" at step S614) the process is terminated. As described above, the DIMM 630 may be utilized even if a defective block has been detected in the DIMM 630 during the electrical test by utilizing the redundant areas as alternative areas for the defective block as disclosed in, for example, Japanese Laid-open Patent Publication No. 2004-55100 (JP-A-2004-55100).

However, in JP-A-2004-55100, a process of putting data into a redundant area instead of a defective area is performed only when defect information is stored when a CPU is electrically tested. Thus, although a defective block may be detected to be present upon shipment, it may be possible to put data, whose writing into the defective block has been instructed, into another area as a refuge, or alternative area. Whereas, for a defective block that has been freshly generated while the information processing apparatus is in operation, it may be difficult to put the data into another area as an alternative area.

In JP-A-2004-55100, an alternative area for the defective block for writing data is limited to the redundant area. Hence, when the capacity of the redundant area is used up, the redundant area may not be used any more as an alternative to the defective block.

In addition, in JP-A-2004-55100, when a defective block is detected during the electrical test, the defective block is repaired in hardware, whereby data, whose writing into the defective block has been instructed, is written into redundant areas. Once the defective block is repaired in hardware, it may be difficult to bring the defective block back to its original state, and thus it becomes difficult to seek out a defective block improving process and to examine fundamental causes for the generation of defective blocks. Thus, for example, a DIMM, in which many defective blocks have been detected, may be discarded with no examination of the fundamental causes for the generation of the defective blocks, and no process for eliminating the occurrence of defective blocks may be performed, thereby reducing the production yield of usable DIMMs.

SUMMARY

According to an embodiment of the invention, there is provided a memory control device configured to control access to a storage device including a plurality of storage areas. The memory control device includes a defect detecting unit configured to detect a defective area of a storage area into which data may not be stored. The memory control device further includes a storage processing unit configured to store defect information including address information of the defective area detected using the defect detecting unit into a memory area. A data writing unit is also included in the memory control device. The data writing unit is configured to write data, which has been written into the defective area, into a storage area other than the storage area including the defective area based on the defect information stored using the storage processing unit.

It is to be understood that both the foregoing general description and the following detailed description are exemplary and explanatory and are not restrictive of the invention, as claimed.

BRIEF DESCRIPTION OF DRAWINGS

The above and other features and advantages of the invention will become apparent from the following description of the embodiments in conjunction with the accompanying drawings, wherein:

FIG. 1 is a block diagram illustrating a configuration of an information processing apparatus in accordance with an embodiment of the invention.

FIG. 2 is a diagram illustrating an example of a defect information management table in accordance with an embodiment of the invention.

FIG. 4B is a flowchart illustrating a process for normal cell non-use mode processing in accordance with an embodiment of the invention.

DESCRIPTION OF EMBODIMENTS

Figure 3A:
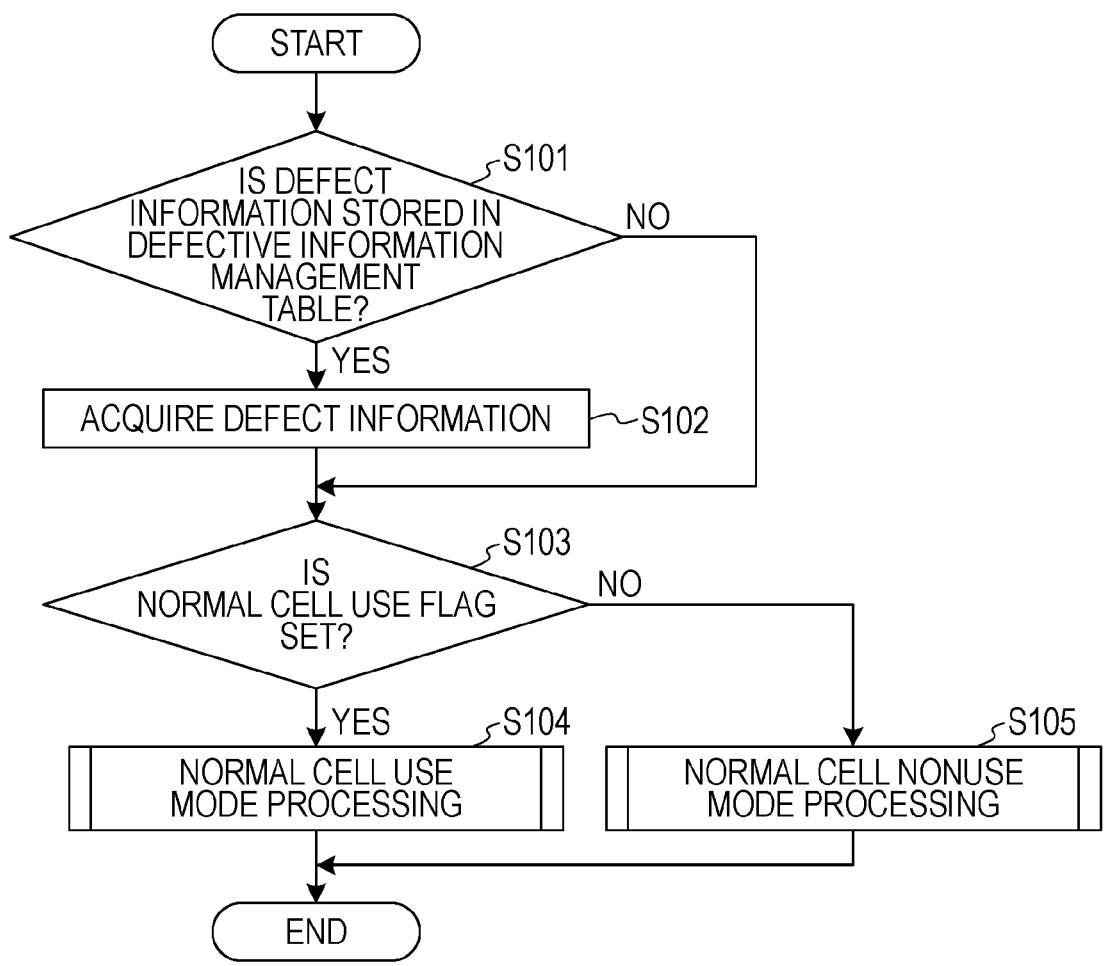
FIG. 3A is a flowchart illustrating a process performed using a memory control device in accordance with an embodiment of the invention.

Embodiments of a memory control device, a memory module, and a memory controlling method will be described in detail with reference to the accompanying drawings.

The invention is not limited to the embodiments described herein. For example, although in the following embodiments, description will be made using a DRAM, which is a volatile memory, as an example of a storage unit, the method described for embodiments of the invention may be applicable to a nonvolatile memory, such as a flush memory, and a disk unit, such as a HDD (Hard Disk Drive). In addition, in the following embodiments, description will be made using a DIMM equipped with a plurality of DRAMs as storage units as an example of a memory module. In the following embodiments, a memory module mounted on an information processing apparatus, such as a personal computer, will also be described. Furthermore, in the following embodiments, description will be made based on the assumption that defect detection can be performed in units of memory cells in the DRAMs (i.e., one memory cell corresponds to one defective area), or can be performed, for example, in units of blocks each including a plurality of memory cells.

First, a configuration of an information processing apparatus according to an embodiment of the invention will be described with reference to the accompanying drawings. FIG. 1 is a block diagram illustrating a configuration of the information processing apparatus in accordance with an embodiment of the invention. FIG. 2 is a diagram illustrating an example of a defect information management table in accordance with an embodiment of the invention.

As illustrated in FIG. 1, an information processing apparatus 1 can include a CPU 10, a memory control device 11, and a DIMM 12. The CPU 10 can include an arithmetic processing unit for performing data calculation and processing and can be configured to instruct the memory control device 11 to write data into the DIMM 12 and to read data output from the DIMM 12. The memory control device 11 can include a device configured to control access of the CPU 10 to the DIMM 12 and can be configured to write data into the DIMM 12 and read data output from the DIMM 12 based on an instruction from the CPU 10. The memory control device 11 can be configured to function as a chip set. The DIMM 12 can include a memory module configured to store various data.

The DIMM 12 can include a plurality of DRAMs 120a to 120d and a storage section 121. Each of the DRAMs 120a to 120d can be a nonvolatile memory in which a storage area can be partitioned into a plurality of memory cells and can function as a storage unit. Each of the plurality of memory cells in each of the DRAMs 120a to 120d can be configured to store one-bit data. In an embodiment of the invention, the plurality of memory cells can include a defective cell. The defective cell can be a memory cell for which data may not be stored.

The storage section 121 can be a nonvolatile storage area (i.e., a predetermined storage area) configured to store information when the memory control device 11 gains access to the DRAMs 120a to 120d. The storage section 121 can also be configured to store a defect information management table 122.

The defect information management table 122 can be configured to store defect information on a memory cell that has been detected as a defective cell. Specifically, as illustrated in FIG. 2, a "DRAM No.," a "Bank No.," a "Row Address," and a "Column Address" of each cell can be stored as address information used to specify a location of a defective cell. The "DRAM No." can include information used to specify a DRAM to which the defective cell belongs, the "Bank No." can include information indicative of a bank to which the defective block belongs among a plurality of banks installed in each DRAM, and "Row Address" and "Column Address" can be a row address and a column address of the defective cell in the bank.

As further illustrated in FIG. 1, the memory control device 11 can include a defect detecting section 111, a storage processing section 112, and a data writing/reading section 113. The defect detecting section 111 can be configured to detect a defective cell for which data may not be stored within a plurality of memory cells. Specifically, the defect detecting section 111, in accordance with an embodiment of the invention, can be configured to perform a defective cell detecting process after data from the DIMM 12 has been read based on the instruction from the CPU 10.

The storage processing section 112 can be configured to store defect information relating to the defective cell, detected using the defect detecting section 111, in the defect information management table 122. The data writing/reading section 113 can be configured to write data, whose writing into the defective cell has been instructed, into a memory cell other than the memory cell stored in the defect information management table 122 based on the defect information stored in the defect information management table 122 using the storage processing section 112.

Next, specific operations of the information processing apparatus, in accordance with an embodiment of the invention, will be described with reference to the accompanying drawings. FIG. 3A is a flowchart illustrating a process using the memory control device 11, in accordance with an embodiment of the invention. FIG. 3A illustrates a process of controlling access to the DIMM 12 using the memory control device 11.

As illustrated in FIG. 3A, when the power source is turned on, the memory control device 11, in accordance with an embodiment of the invention, can be configured to determine whether defect information is stored in the defect information management table 122 (step S101). In this process, when the defect information is determined to be stored in the defect information management table 122 ("Yes" at step S101), the memory control device 11 can be configured to acquire the defect information stored in the defect information management table 122 (step S102), and the acquired defect information can be stored in a predetermined area (not illustrated) in the memory control device 11.

Figure 3B:
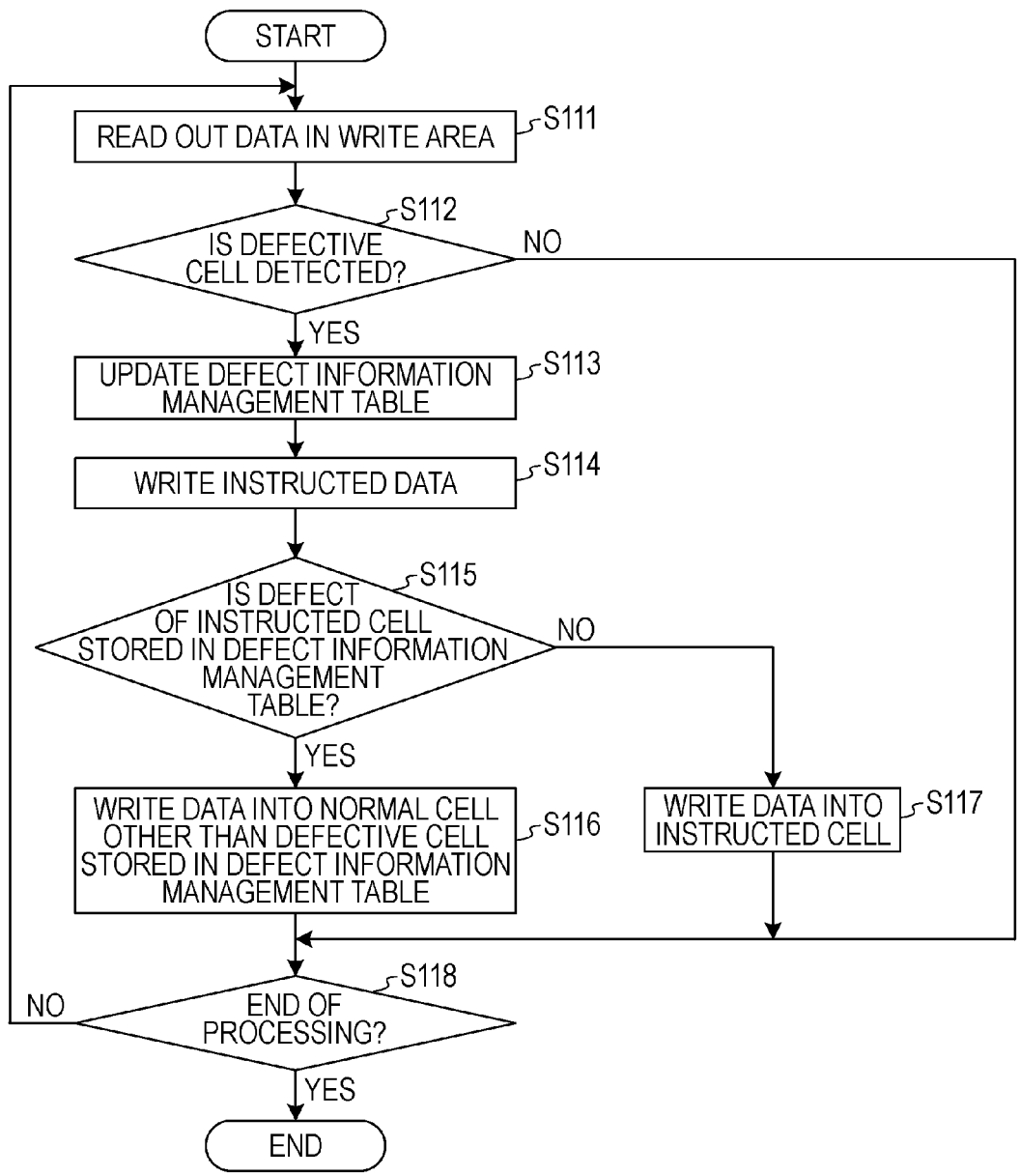
FIG. 3B is a flowchart illustrating a process for normal cell use mode processing in accordance with an embodiment of the invention.

At the completion of step S102, or when any defect information is not stored in the defect information management table at step S101 ("No" at step S101), the memory control device 11 can be configured to determine whether a flag indicating that a normal cell is used (hereafter, referred to as a normal cell use flag) is set (step S103). When the normal cell use flag is determined to be set in this process ("Yes" at step S103), the memory control device 11 can be configured to execute normal cell use mode processing (step S104). In the example illustrated in FIG. 3A, the normal cell use mode can be a mode where, when a memory cell into which data writing has been instructed is a defective cell, the data can be written into another memory cell (a process of putting data into an alternative area). The normal cell use mode processing is illustrated in FIG. 3B and will be described later.

Figure 3C:
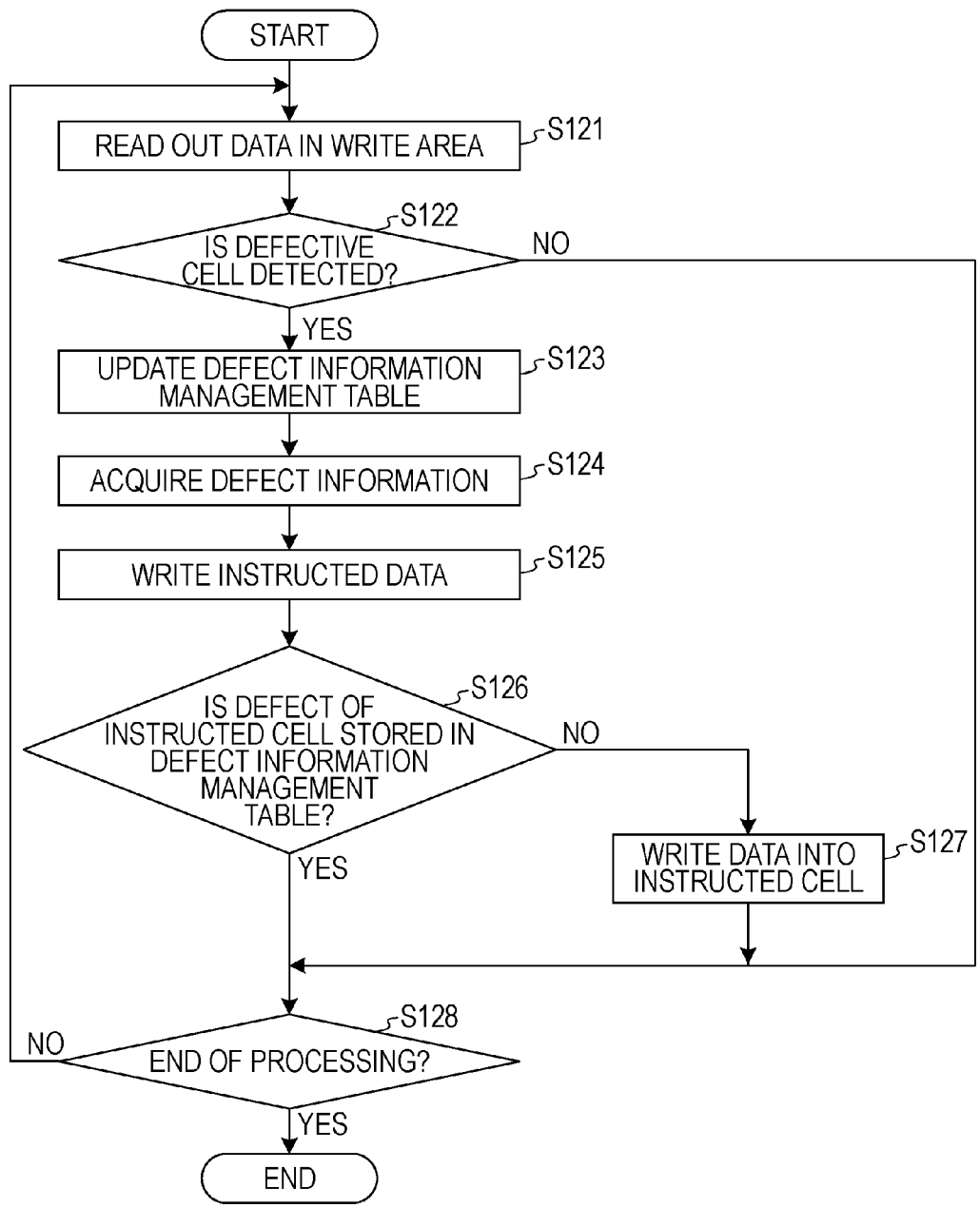
FIG. 3C is a flowchart illustrating a process for normal cell non-use mode processing in accordance with an embodiment of the invention.

On the other hand, when the normal cell use flag is not set ("No" at step S103), the memory control device 11 can be configured to execute normal cell non-use mode processing (step S105). In this example, the normal cell non-use mode can be a mode where, when a memory cell into which data writing has been instructed is a defective cell, data that has been written into the defective cell is not written into another memory cell (the process of putting data into an alternative area), but rather is used, for example, in an electrical test performed before shipment. FIG. 3C illustrates the normal cell non-use mode processing which will be described later. At the completion of step S104 or step S105, the memory control device 11 can be configured to terminate the process relating to control of access to the DIMM 12.

Next, the normal cell use mode processing to be executed at step S104 will be described with reference to FIG. 3B. FIG.

3B is a flowchart illustrating a process for normal cell use mode processing in accordance with an embodiment of the invention.

As illustrated in FIG. 3B, when the normal cell use mode processing is started, the data writing/reading section 113 of the memory control device 11 can be configured to read one piece of data stored in storage areas of the DRAMs 120a to 120d which has been instructed from the CPU 10 (step S111). Then, the defect detecting section 111 can be configured to determine whether a defective cell has been detected (step S112). In this process, when it is determined that the defective cell has been detected ("Yes" at step S112), the storage processing section 112 can be configured to write defect information on the detected defective cell into the defect information management table 122 (step S113) as a process of updating the defect information management table 122, and further configured to acquire the defect information stored in the updated defect information management table 122.

Then, the data writing/reading section 113 can be configured to write data, which has been instructed from the CPU 10, into a designated storage area (step S114). In this process, the data writing/reading section 113 can be configured to write the data into the designated storage area regardless of whether a defective cell is included in the storage area into which data writing has been instructed.

Then, the data writing/reading section 113 can be configured to determine whether a defective cell is present in memory cells into which data writing has been instructed by referring to the defect information management table 122 (step S115). In this process, when it is determined that the defective cell is present in the memory cells into which data writing has been instructed ("Yes" at step S115), the data writing/reading section 113 can be configured to write the data which has been written into the defective cell at step S114 into a normal memory cell (step S116). Specifically, the data writing/reading section 113 can be configured to determine memory cells (i.e., memory cells which are not detected as defective cells) other than the memory cell stored in the defect information management table 122 to be normal memory cells and can be further configured to put the data that has been written into the defective cell into any one of the memory cells that have been judged as normal memory cells as an alternative area.

On the other hand, any defective cell that is not present in the memory cells into which data writing has been instructed at step S115 ("No" at step S115), the data writing/reading section 113 can be configured to write the data into a memory cell into which data writing has been instructed (step S117). At the completion of steps S116 and S117, or when a defective cell is not detected at step S112 ("No" at step S112), the memory control device 11 can be configured to make the process proceed to step S118.

At step S118, the memory control device 11 can be configured to determine whether an end of the process has been instructed. The instruction to end the process implies, for example, a power source turning off operation. In this process, when an end of the process is not instructed ("No" at step S118), the memory control device 11 can be configured to return the process to step S111. On the other hand, when it is determined that the end of the process has been instructed ("Yes" at step S118), the memory control device 11 can be configured to terminate the process relating to control of access to the DIMM 12.

Next, a process for the normal cell non-use mode processing executed at step S105 will be described with reference to FIG. 3C. The FIG. 3C is a flowchart illustrating a process for the normal cell non-use mode processing in accordance with an embodiment of the invention.

As illustrated in FIG. 3C, when the normal cell non-use mode processing is started, the memory control device 11 can be configured to read data that has been instructed from the CPU 10 out of the DRAM 120 (step S121). Then, the defect detecting section 111 can be configured to determine whether a defective cell has been detected (step S122). In this process, when it is determined that the defective cell has been detected ("Yes" at step S122), the storage processing section 112 can be configured to write defect information on the detected defective cell into the defect information management table 122 as a process for updating the defect information management table 122 (step S123) and can be further configured to acquire the defect information stored in the updated defect information management table 122 (step S124).

Next, the data writing/reading section 113 can be configured to write data, whose writing has been instructed from the CPU 10, into a designated storage area (step S125). In this process, the data writing/reading section 113 can be configured to write the data into the designated storage area regardless of whether a defective cell is included in the storage area into which data writing has been instructed.

Then, the data writing/reading section 113 can be configured to determine whether a defective cell is present in the memory cells into which data writing has been instructed by referring to the defect information management table 122 (step S126). In this process, when it is determined that the defective cell is present in the memory cells into which data writing has been instructed ("Yes" at step S126), the data writing/reading section 113 can be configured not to write data into a normal memory cell, i.e., the data writing/reading section 113 can be configured not to put the data into an alternative area and can be further configured to make the process proceed to step S128.

On the other hand, at step S127, when any defective cell is present in the memory cells into which data writing has been instructed ("No" at step 126), the data writing/reading section 113 can be configured to write the data into the memory cells into which data writing has been instructed (step S127).

When it has been determined that the defective cell is present in the memory cells into which data writing has been instructed ("Yes" at step S126), when execution of the process at step S127 is completed, or when a defective cell is not detected at step 122 ("No" at step S122), the memory control device 11 can be configured to determine whether an end of the process has been instructed (step S128). In this process, when the end of the process is not instructed ("No" at step S128), the memory control device 11 can be configured to return the process to step S121. When it is determined that the end of the process has been instructed ("Yes" at step S128), the memory control device 11 can be configured to terminate the process relating to control of access to the DIMM 12.

As described above, when a data writing instruction has been received from the CPU 10 in the normal cell non-use mode processing, the memory control device 11 can be configured not to perform a process of putting the data written into the defective cell into an alternative area even when the defective cell is included in the data written area.

As described above, in an embodiment of the invention, when data writing into the DIMM 12 has been instructed, a defective cell detecting process can be performed. When a defective cell is detected, defect information on the defective cell can be stored in the defect information management table 122. Then, data, whose writing into the defective cell has been instructed, can be put into a normal memory cell as an alternative area based on the defect information stored in the defect information management table 122. Owing to the previously discussed process, the information processing apparatus 1 can be continuously used without stopping the operation thereof even when a memory error has occurred in the DRAMs while the information processing apparatus 1 is being used.

In addition, in an embodiment of the invention, an alternative area into which data, whose writing into a defective cell has been instructed, is to be put can be any one of the normal memory cells other than the defective cell, and the data can be withdrawn from the defective cell and put into the alternative area without limiting the capacity of the alternative area to a capacity that has been designated in advance.

In the aforementioned embodiment of the invention, instructed data writing can be performed after data from the region has been read in accordance with the instruction from the CPU 10 and the defective cell has been detected. As an alternative, immediately after data instructed from the CPU 10 has been written, the written data can be read and detection of a defective cell can be performed. Next, an embodiment will be described with reference to the accompanying drawings. The same numerals are assigned to the same constitutional elements as those which have already been described above and hence description thereof will be omitted.

Figure 4A:
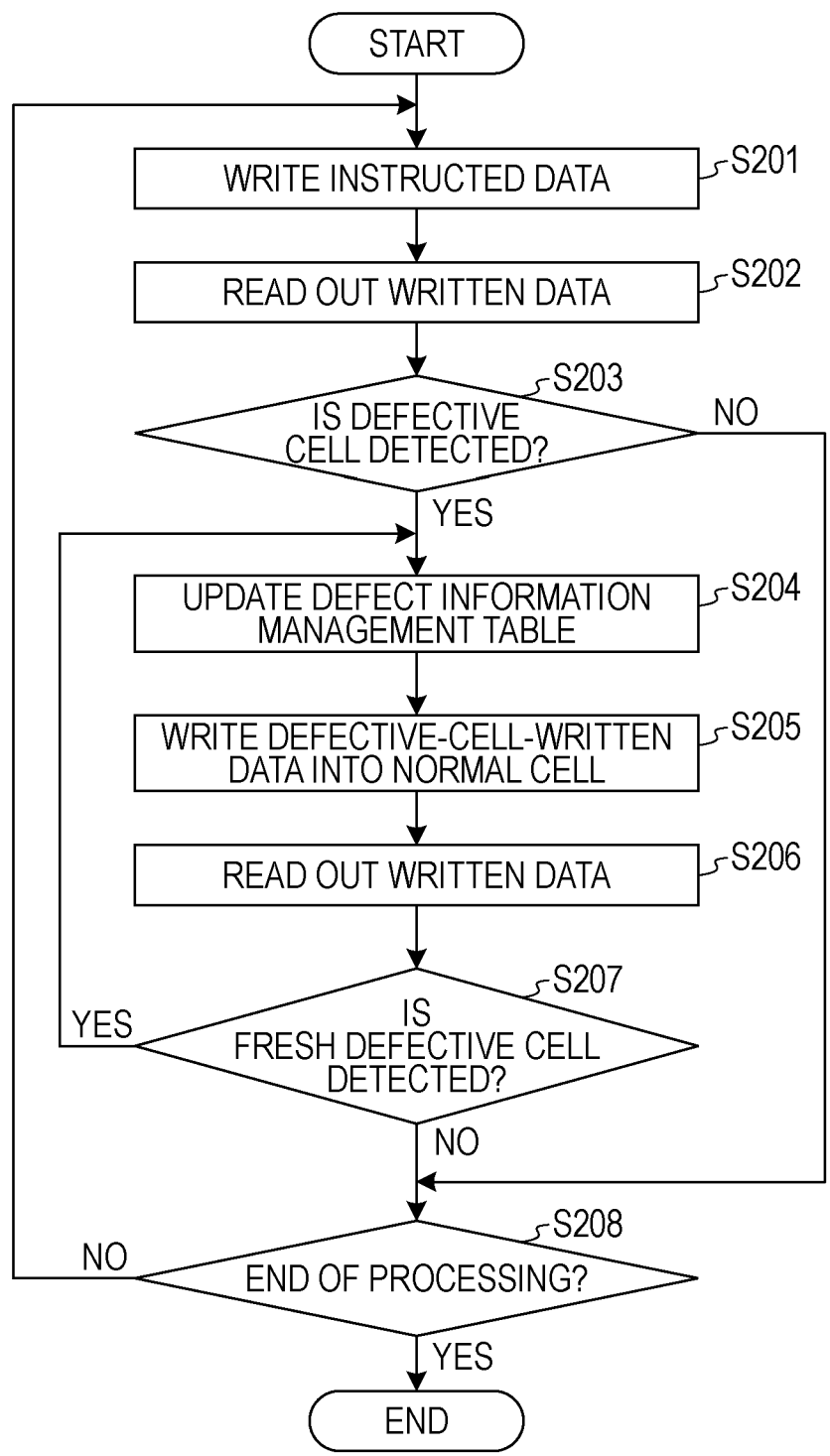
FIG. 4A is a flowchart illustrating a process for normal cell use mode processing in accordance with an embodiment of the invention.

FIG. 4A is a flowchart illustrating a process for normal cell use mode processing in accordance with an embodiment of the invention. As illustrated in FIG. 4A, when the normal cell use mode processing is started, the data writing/reading section 113 can be configured to write data, whose writing has been instructed, into the DIMM 12 (step S201). Then, the defect detecting section 111 can be configured to read the data written at step S201 (step S202).

Next, the defect detecting section 111 can be configured to determine whether a defective cell has been detected (step S203). Specifically, the defect detecting section 111 can be configured to specify data that is not written into the DRAMs 120a to 120d based on a difference between written data that has been written into the DRAMs 120a to 120d and can be further configured to read data from the DRAMs 120a to 120d to determine a memory cell into which the data has been written as a defective cell. In this process, when it is determined that the defective cell has been detected ("Yes" at step S203), the storage processing section 112 can be configured to write defect information on the detected defective cell into the defect information management table 122 to update the defect information management table 122 (step S204) and can be further configured to acquire the defect information stored in the updated defect information management table 122.

Next, the data writing/reading section 113 can be configured to write the data which has been written into the defective cell at step S201 into a normal cell (step S205). Then, the defect detecting section 111 can be configured read again the data which has been written at step S205 (step S206) and can be further configured to determine whether a defective cell has been freshly detected (step S207). In this process, when it is determined that the defective cell has been freshly detected ("Yes" at step S207), the storage processing section 112 can be configured to return the process to step S204. In an embodiment of the invention, the defective cell detecting process can be repeated until a fresh defective cell is no longer detected in the previously discussed manner.

When a defective cell is not detected at step S203 ("No" at step S203), or a defective cell is not freshly detected at step S207 ("No" at step S207), the memory control device 11 can be configured to make the process proceed to step S208.

At step S208, the memory control device 11 can be configured to determine whether the end of the process has been instructed. In this process, when the end of the process is not instructed ("No" at step S208), the memory control device 11 can be configured to return the process to step S201. On the other hand, when it is determined that the end of the process has been instructed (step S208), the memory control device 11 can be configured to terminate the normal cell use mode processing.

Next, normal cell non-use mode processing in accordance with an embodiment of the invention will be described with reference to FIG. 4B. FIG. 4B is a flowchart illustrating a process for the normal cell non-use mode processing in accordance with an embodiment of the invention.

As illustrated in FIG. 4B, when the normal cell nonuse mode processing is started, the data writing/reading section 113 can be configured to write data, whose writing has been instructed, into the DIMM 12 (step S211). Then, the defect detecting section 111 can be configured to read the data written at step S211 (step S212) and can be further configured to determine whether a defective cell has been detected (step S213). Specifically, the defect detecting section 111 can be configure to specify a defective cell based on a difference between the write data and the read data as in the case at step S203, as illustrated in FIG. 4A. In this process, when it is determined that the defective cell has been detected ("Yes" at step S213), the storage processing section 112 can be configured to write defect information on the detected defective cell into the defect information management table 122 to update the defect information management table 122 (step S214) and can be further configured to acquire the defect information stored in the updated defect information management table 122 (step S215).

At the completion of step S215, or when a defective cell is not detected at step S213 ("No" at step S213), the memory control device 11 can be configured to make the process proceed to step S216. At step S216, the memory control device 11 can be configured to determine whether the end of the process has been instructed. In this process, when the end of the process is not instructed ("No" at step S216), the memory control device 11 can be configured to return the process to step S211. On the other hand, when it is determined that the end of the process has been instructed ("Yes" at step S216), the memory control device 11 can be configured to terminate the normal cell non-use mode processing.

Figure 4C:
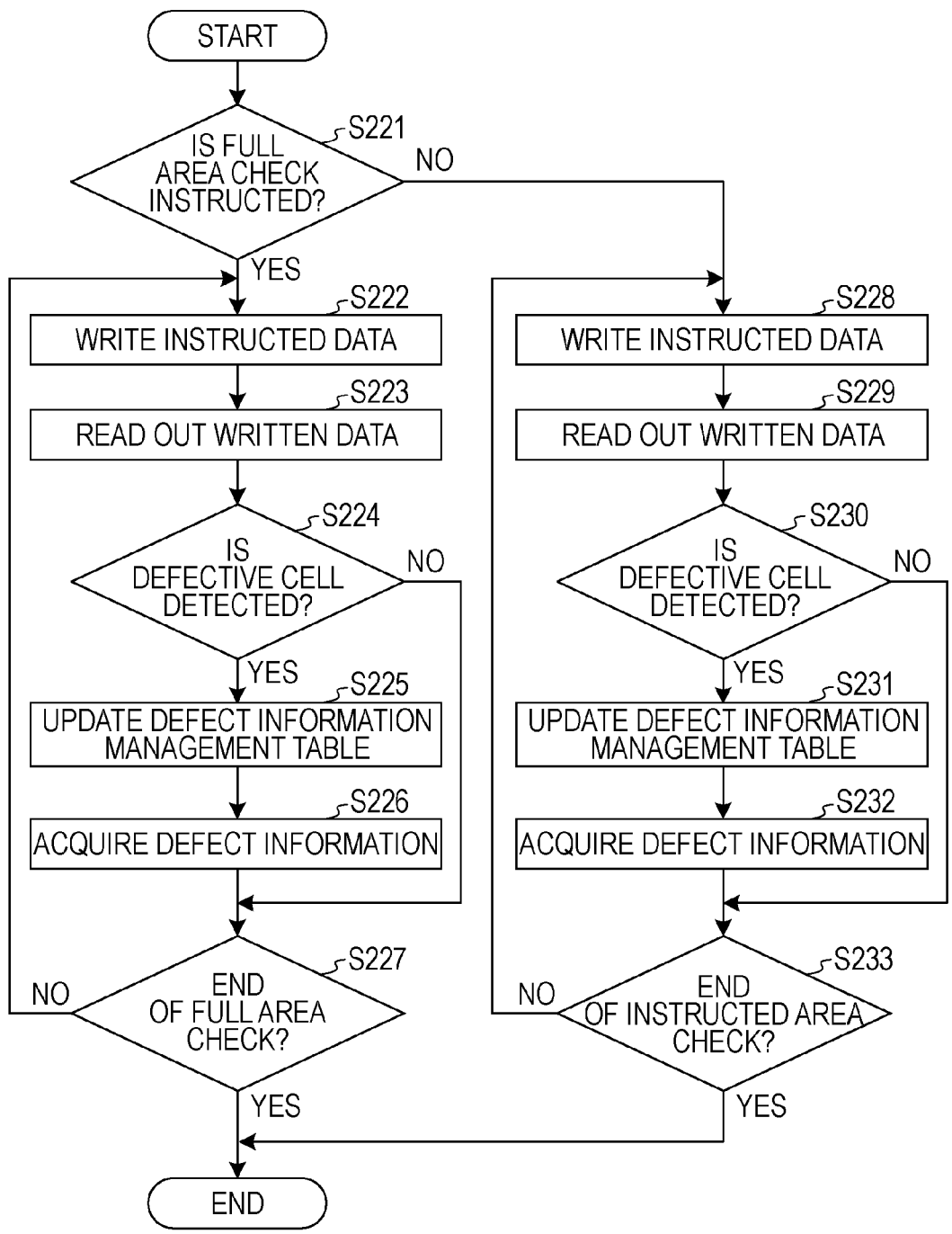
FIG. 4C is a flowchart illustrating another example of the process for the normal cell non-use mode processing in accordance with an embodiment of the invention.

In an embodiment of the invention, a full area check can be performed in the previously discussed normal cell non-use mode processing. The full area check can be a process of performing the defective cell detecting process on all the memory cells in the DRAMs 120a to 120d using the defect detecting section 111. Next, normal cell non-use mode processing performed in the previously discussed case will be described with reference to FIG. 4C. FIG. 4C is a flowchart illustrating another example of a process for the normal cell non-use mode processing in accordance with an embodiment of the invention.

As illustrated in FIG. 4C, when the normal cell nonuse mode processing is started, the memory control device 11 can be configured to determine whether a full area check has been instructed from the CPU 10 (step S221). In this process, when it is determined that the full area check has been instructed by the CPU 10 ("Yes" at step S221), the data writing/reading section 113 can be configured to write data, whose writing has been instructed, into all areas in each of the DRAMs 120a to 120d (step S222). The data written in this process can be test data used to perform a defective cell detecting process. Then, the defect detecting section 111 can be configured to read the data that has been written at step S222 (step S223).

Next, the defect detecting section 111 can be configured to determine whether a defective cell has been detected (step S224). Specifically, the defect detecting section 111 can be configured to specify the defective cell based on a difference between the write data and the read data as in the case at step 203, as illustrated in FIG. 4A.

When it is determined that the defective cell has been detected in the process at step S224 ("Yes" at step S224), the storage processing section 112 can be configured to write defect information on the detected defective cell into the defect information management table 122 (step S225) as a process of updating the defect information management table 122 and can be further configured to acquire the defect information stored in the updated defect information management table 122 (step S226).

Then, the memory control device 11 can be configured to determine whether execution of the full area check has been completed (step S227). In this process, when execution of the full area check is not completed ("No" at step S227), the memory control device 11 can be configured to return the process to step S222.

On the other hand, when the full area check is not instructed at step S221 ("No" at step S221), the memory control device 11 can be configured to execute the processes at steps S228 to S232 as an instructed area checking process. The instructed area checking process can be a process of performing a defective cell detecting process on a designated memory cell among all the memory cells in the DRAMs 120a to 120d. The processes at the steps S228 to S232 can be the same as those at steps S211 to S215, as illustrated in FIG. 4B, and hence description thereof will be omitted.

At the completion of step S232, the memory control device 11 can be configured to determine whether execution of the instructed area check has been completed (S233). In this process, when execution of the instructed area check is not completed ("No" at step S233), the memory control device 11 can be configured to return the process to step S228.

At step S227, when it is determined that execution of the full area check has been completed ("Yes" at step S227) or when it is determined that execution of the instructed area check has been completed at step S233 (Yes at step S233), the memory control device 11 can be configured to terminate the normal cell non-use mode processing.

As described above, in an embodiment of the invention, when a data writing instruction has been received from the CPU 10, data is immediately read after the data has been written to detect a defective cell. Therefore, more accurate defective cell detection can be possible. In addition, in an embodiment of the invention, the defective cell detecting process can be repeated until a defective cell is no longer freshly detected, and hence more secure defective cell detection can be possible.

Figure 5:
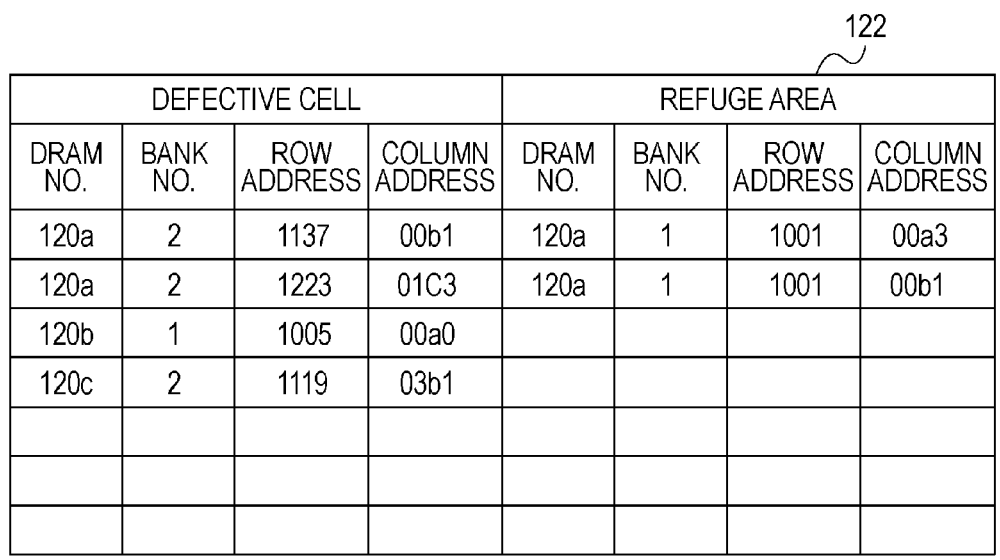
FIG. 5 is a diagram illustrating an example of a defect information management table in accordance with an embodiment of the invention.

Although in the previously discussed embodiments, an alternative area into which data, whose writing into a defective cell has been instructed, is put may not be limited to a specific area, when a redundant area is present in the storage areas of each of the DRAMs 120a to 120d, the data, whose writing into the defective cell has been instructed, can be written into the redundant area. Next, an embodiment of the invention will be described with reference to the accompanying drawings. The same numerals are assigned to the same constitutional elements as those which have been already described and hence description thereof will be omitted. FIG. 5 is a diagram illustrating an example of a defect information management table in accordance with an embodiment of the invention.

Figure 6A:
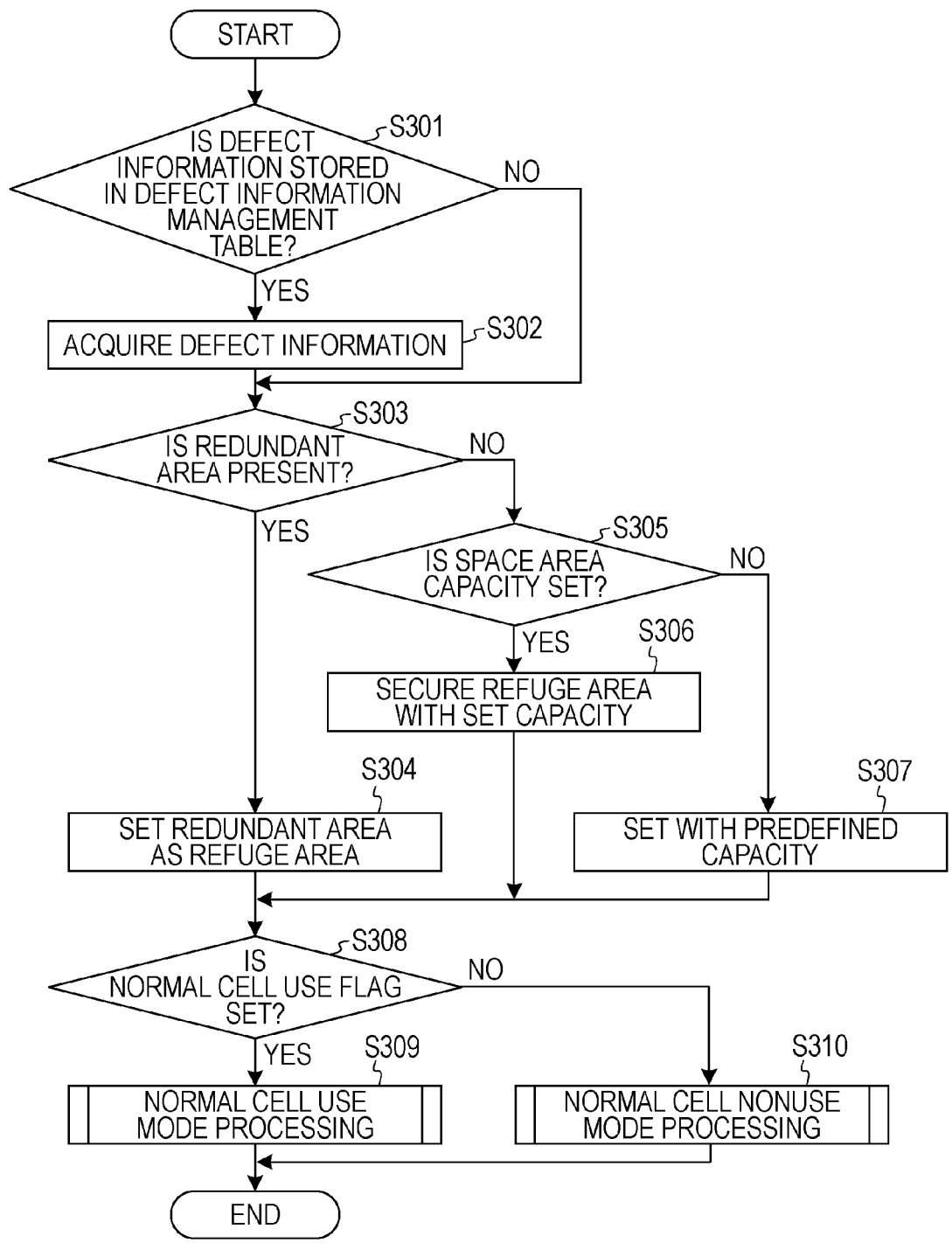
FIG. 6A is a flowchart illustrating a process performed using a memory control device in accordance with an embodiment of the invention.
Figure 6B:
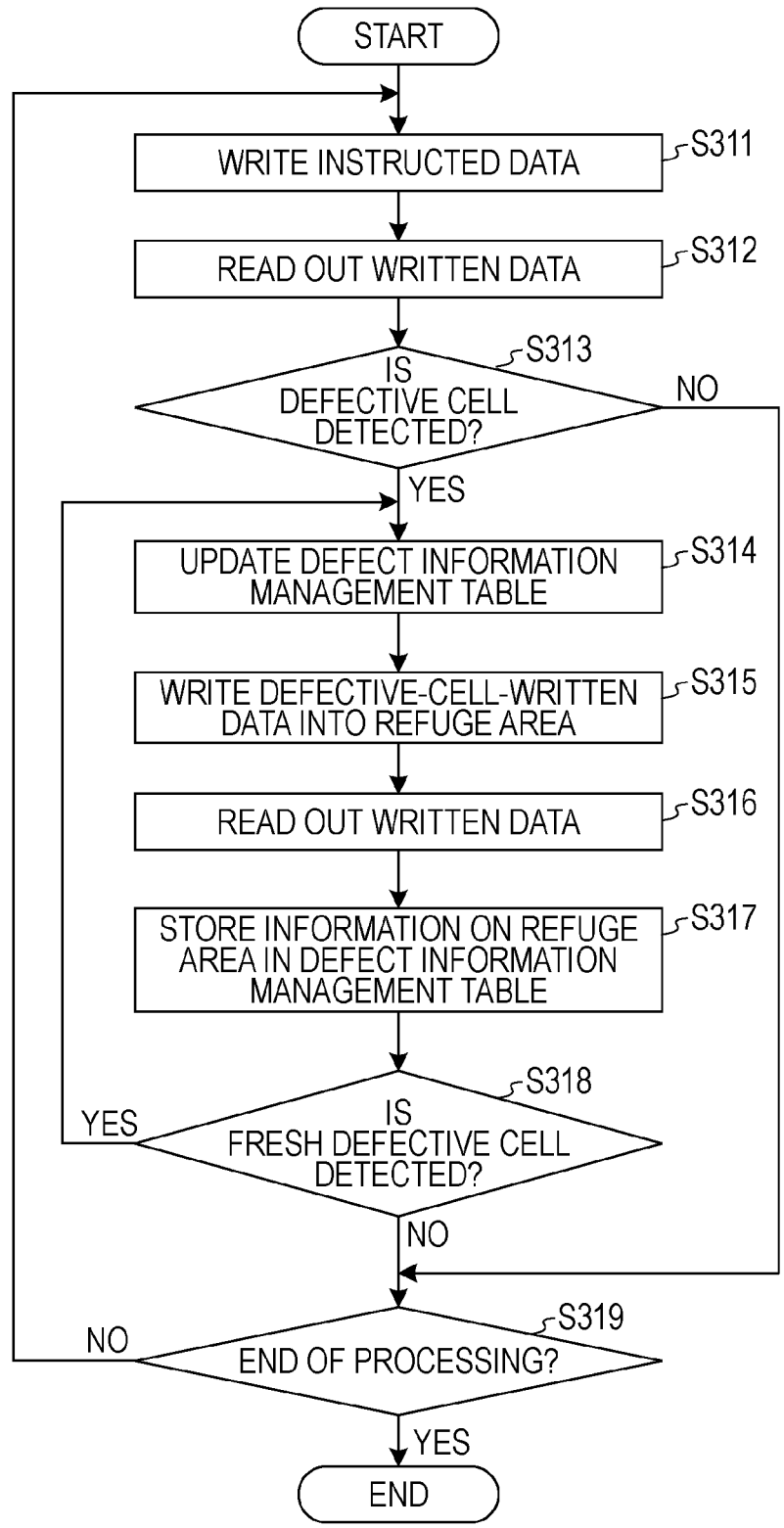
FIG. 6B is a diagram illustrating a process for normal cell use mode processing in accordance with an embodiment of the invention.

The defect information management table 122 according to an embodiment of the invention can be configured to store information used to specify an alternative area for data, whose writing into a defective cell has been instructed, to be related to defect information on the defective cell, as illustrated in FIG. 5, in addition to the information stored in the defect information management table 122, as illustrated in FIG. 2. Specifically, the defect information management table 122 can be configured to store "DRAM No.," "Bank No.," "Row Address," and "Column Address" as information used to specify the alternative area. The information in the alternative area may be in a not-yet stored state at a stage when the defect information management table 122 has been undated at step S314, as illustrated in FIG. 6B, which will be described later.

Next, specific operations of the memory control device 11 according to an embodiment of the invention will be described with reference to FIG. 6A. FIG. 6A is a flowchart illustrating a process using the memory control device 11 in accordance with an embodiment of the invention. The processes executed at steps S301 and S302 are the same as those at steps S101 and S102, as illustrated in FIG. 3A, and hence description thereof will be omitted.

As illustrated in FIG. 6A, when execution of the process at step S302 is completed or when a defect information is not stored in the defect information management table 122 at step S301 ("No" at step S301), the memory control device 11 can be configured to determine whether a redundant area is present in the storage areas of DRAMs 120a to 120d (step S303). In the example illustrated in FIG. 6A, the redundant area can be an alternative area into which data, whose writing into a defective cell concerned has been instructed, can be written and can be an area inherent to a vender that is not normally used by a user. In this process, when it is determined that the redundant area is present in the storage areas of the DRAMs 120a to 120d (Yes at step S303), the memory control device 11 can be configured to use the redundant area is as an alternative area for the data, whose writing into the defective cell has been instructed (step S304).

On the other hand, when any redundant area is not present in the storage areas of the DRAMs 120a to 120d at step S303 ("No" at step 303), the memory control device 11 can be configured to determine whether the capacity of a space area to be used as an alternative area is set (step S305). The space area can be a storage area that is not currently being used among the storage areas of the DRAMs 120a to 120d. In this process, when it is determined that the capacity of the space area is set ("Yes" at step S305), the memory control device 11 can be configured to secure an alternative area of a previously set capacity from within space areas present in the DRAMs 120a to 120d (step S306). On the other hand, when it is determined that the capacity of the space area is not set at step S305 (No at step S305), the memory control device 11 can be configured to set a space area of a predefined capacity as the alternative area (step S307). A process of putting data, whose writing into the defective cell has been instructed, into the alternative area can be surely executed in the previously discussed manner by securing the alternative area prior to execution of a data writing process even when any redundant area is not present.

When an execution of processes at steps S304, S306 and S307 is completed, the memory control device 11 can be configured to determine whether a normal cell use flag is set (step S308). In this process, when it is determined that the normal cell use flag is set ("Yes" at step 308), the memory control device 11 can be configured to execute the normal cell use mode processing (step S309). On the other hand, when the normal cell use flag is not set ("No" at step S308), the memory control device 11 can be configured to execute the normal cell non-use mode processing (step S310). The normal cell non-use mode processing at step S310 can be similar to the processing illustrated in FIG. 4B or FIG. 4C, and hence description thereof will be omitted. When an execution of the processes at steps S309 and S310 is completed, the memory control device 11 can be configured to terminate the process of gaining access to memory cells.

Next, the normal cell use mode processing to be executed at step S309 will be described with reference to FIG. 6B. FIG. 6B is a flowchart illustrating a process for the normal cell use mode processing in accordance with an embodiment of the invention.

As illustrated in FIG. 6B, when the normal cell use mode processing is started, the data writing/reading section 113 can be configured to write data, whose writing has been instructed, into the DIMM 12 (step S311). The defect detecting section 111 can be configured to read the data written at step S311 (step S312) and can be further configured to determine whether a defective cell has been detected (step S313). In this process, when it is determined that the defective cell has been detected ("Yes" at step S313), the storage processing section 112 can be configured to write defect information on the detected defective cell into the defect information management table 122 as a process of updating the defect information management table 122 (step S314) and can be further configured to acquire the defect information stored in the updated defect information management table 122.

Next, the data writing/reading section 113 can be configured to write the data that has been written into the defective cell at step S311 into the alternative area set by executing the process at any one of steps S304, S306 and S307, as illustrated in FIG. 6A (step S315). As described above, in an embodiment of the invention, when the alternative area prepared in advance corresponding to a memory cell is not present, the data writing/reading section 113 can be configured to write the data that has been written into the defective cell into the alternative area that has been secured from among space areas present in the DRAMs 120a to 120d as the alternative area of a capacity that has been set in advance.

Next, the defect detecting section 111 can be configured to read the data that has been written into the alternative area (step S316), and the storage processing section 112 can be configured to store information in the alternative area into the defect information management table 122 (step S317). Specifically, the storage processing section 112 can be configured to set a memory cell in the alternative area, that has stored the read-out data, as the alternative area corresponding to the defective cell, which has been an object into which the test data is to be written, to store information on the memory cell in the defect information management table 122. Owing to the previously discussed operation, information in the alternative area can be stored in the defect information management table 122.

Next, the defect detecting section 111 can be configured to determine whether a fresh defective cell has been detected based on the data read out at step S316 (step S318). In this process, when it is determined that the fresh defective cell has been detected ("Yes" at step S318), the storage processing section 112 can be configured to return the process to step S314. As described above, in this embodiment, the defective cell detecting process can be repeated until a fresh defective cell is no longer detected.

On the other hand, when a defective cell is not detected at step S313 ("No" at step S313) or a fresh defective cell is not detected at step S318 ("No" at step S318), the memory control device 11 can be configured to make the process proceed to step S319.

At step S319, the memory control device 11 can be configured to determine whether the end of the process has been instructed. In this process, when the end of the process is not instructed ("No" at step S319), the memory control device 11 can be configured to return the process to step S311. On the other hand, when it is determined that the end of the process has been instructed ("Yes" at step S319), the memory control device 11 can be configured to terminate the normal cell use mode processing.

As described above, in an embodiment of the invention, when an alternative area into which data, whose writing into a defective cell has been instructed, is to be written has been set in advance in the storage areas of the DRAMs 120a to 120d, the data, whose writing into the defective cell has been instructed, can be written into the alternative area. Labor taken to set an alternative area can be saved by using the alternative area that has been set in advance as discussed above.

In an embodiment of the invention, the memory control device can include a test mode for performing an electrical test before shipment. In the test mode, the memory control device, in accordance with an embodiment of the invention, can be configured to determine the number of defective cells included in the DIMM 12. When the number of defective cells included in the DIMM 12 becomes larger than a standard value, the DIMM 12 can be excluded goods for shipment with no execution of a repairing process on the defective cells. Owing to the previously discussed operation, as discussed for an embodiment of the invention, examination can be performed even on a DIMM that has been excluded from a shipment because of a large number of defective cells to seek out the fundamental causes and to improve the DIMM for placing the DIMM into the market place, thereby reducing the production yield of the manufactured DIMMs.

Figure 7:
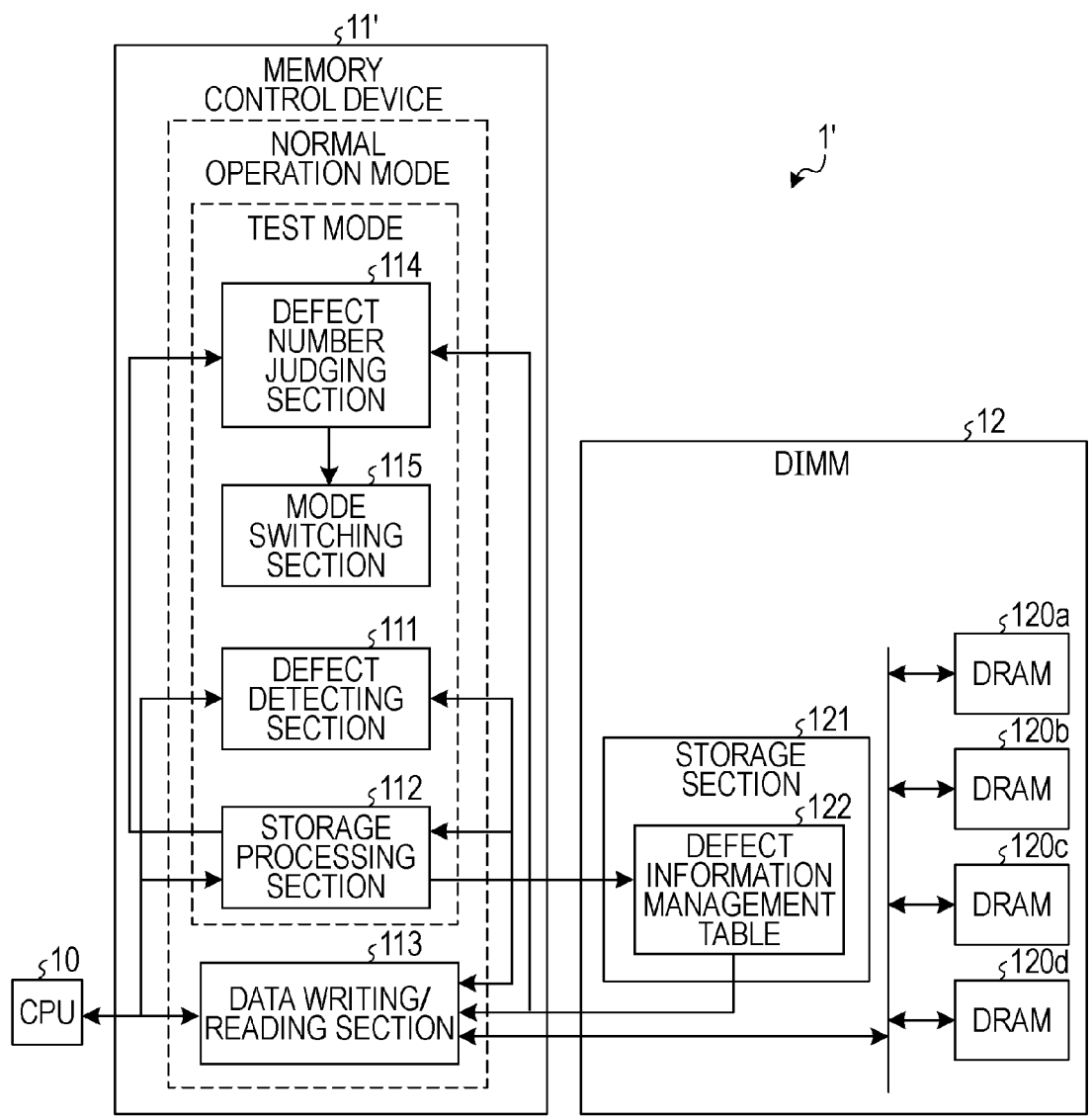
FIG. 7 is a block diagram illustrating a configuration of an information processing apparatus in accordance with an embodiment of the invention.

Next, an information processing apparatus according to an embodiment of the invention will be described with reference to the accompanying drawings. The same numerals are assigned to the same constitutional elements as those which have been already described and hence description thereof will be omitted. FIG. 7 is a block diagram illustrating a configuration of an information processing apparatus in accordance with an embodiment of the invention.

As illustrated in FIG. 7, a memory control device 11 can include a defect number judging section 114 and a mode switching section 115 in addition to the previously described defect detecting section 111, the storage processing section 112, and the data writing/reading section 113. In this embodiment, a difference between a normal operation mode and a test mode lies is based on whether the data writing/reading section 113 performs the process of putting data written into a defective cell into a normal cell as an alternative area to the defective cell. Thus, in the test mode, the memory control device 11 can be configured not to perform the process of putting the data into another memory cell as an alternative area even when the data has been written into the defective cell.

The defect number judging section 114 can be configured to determine whether the number of defective cells included in the DRAMs 120a to 120d of the DIMM 12 is larger than a predetermined number that has been set in advance. The mode switching section 115 can be configured to switch a mode operation from the test mode to a normal operation mode when, in the test mode, the defect number judging section 114 determines that the number of defective cells is smaller than the predetermined number.

Figure 8A:
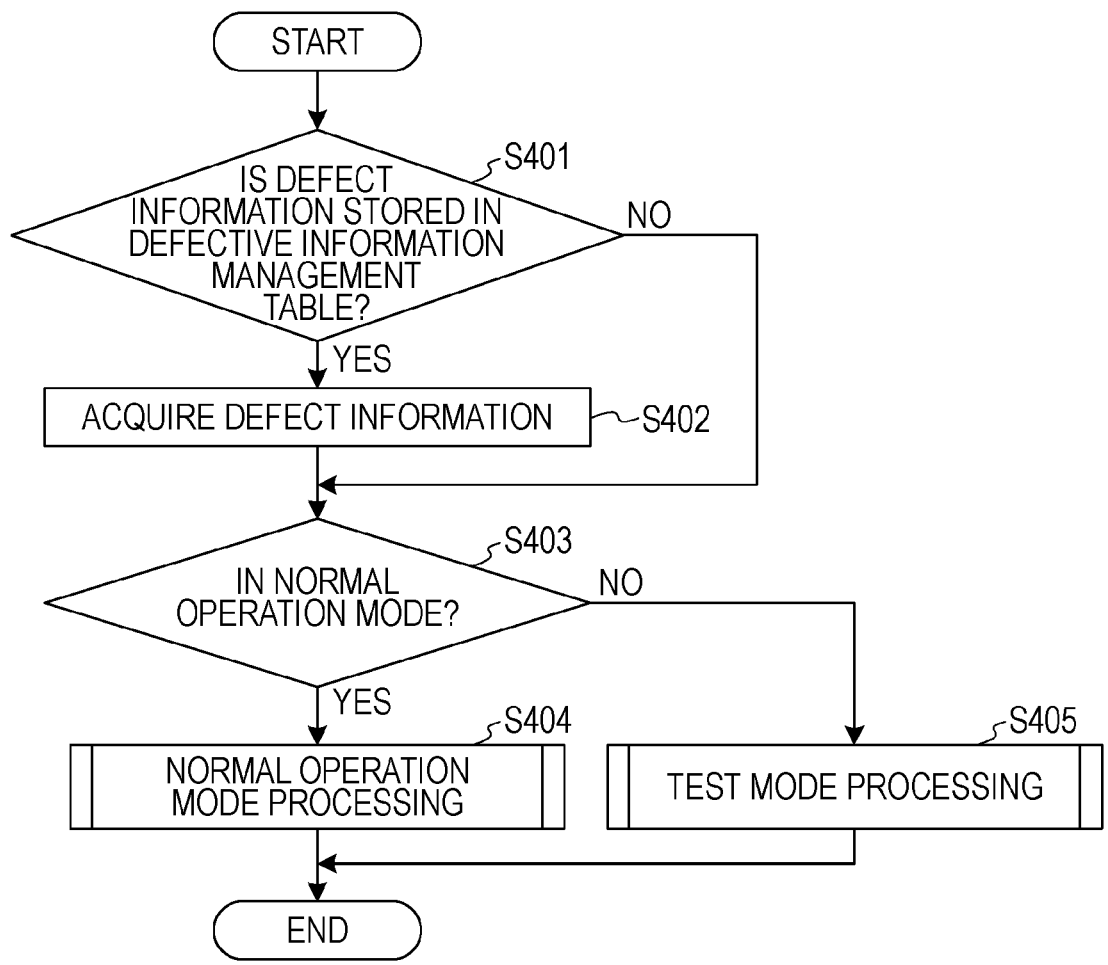
FIG. 8A is a diagram illustrating a process performed using a memory control device in accordance with an embodiment of the invention.

Next, the operations of the memory control device 11 in accordance with an embodiment of the invention will be described with reference to the accompanying drawings. FIG. 8A is a flowchart illustrating a process performed using the memory control device in accordance with an embodiment of the invention. The processes at steps S401 and S402 can be similar to those at steps S101 and S102, as illustrated in FIG. 3A and hence description thereof will be omitted.

As illustrated in FIG. 8A, at step S403, the memory control device 11 can be configured to determine whether the normal operation mode is currently active. In this process, when it is determined that the normal operation mode is currently active ("Yes" at step S403), the memory control device 11 can be configured to execute normal operation mode processing (step S404). The normal operation mode processing can be similar to the processing illustrated in FIG. 4A and hence description thereof will be omitted.

Figure 8B:
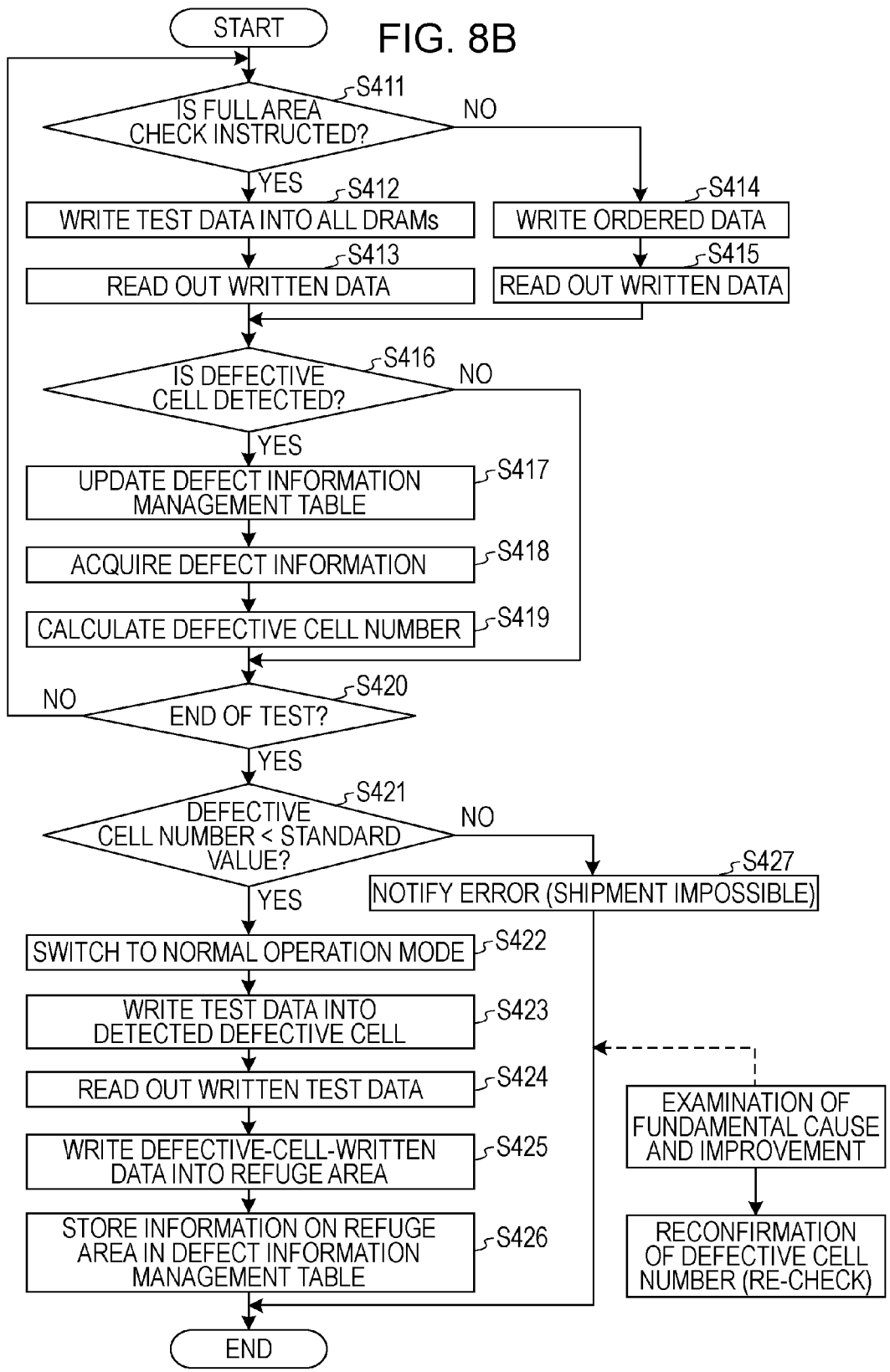
FIG. 8B is a diagram illustrating a process for test mode processing in accordance with an embodiment of the invention.

On the other hand, at step S403, when it is determined that the normal operation mode is not currently active ("No" at step S403), the memory control device 11 can be configured to execute the test mode processing (step S405). The test mode processing is illustrated in FIG. 8B and will be described later. When an execution of the processes at steps S404 and S405 is completed, the memory control device 11 can be configured to terminate the process relating to control of access to the DIMM 12.

Next, a process for the test mode processing to be executed at step S403 will be described with reference to FIG. 8B. FIG. 8B is a flowchart illustrating the process for the test mode processing in accordance with an embodiment of the invention.

As illustrated in FIG. 8B, when the test mode processing is started, the memory control device 11 can be configured to determine whether a full area check has been instructed from the CPU 10 (step S411). In this process, when it is determined that the full area check has been instructed from the CPU 10 ("Yes" at step S411), the defect detecting section 111 can be configured to write data into all the areas in the respective DRAMs 120a to 120d (step S412) and can be further configured to read data stored in the respective DRAMs 120a to 120d (step S413).

On the other hand, when the full area check is not instructed at step S411 ("No" at step S411), the memory control device 11 can be configured to write data, whose writing has been instructed, into the DIMM 12 as a designated area checking process (step D414), and can be further configured to read the data written at step S414 (step S415). Thus, time taken for processing may be reduced by performing the defective cell detecting process only on a designated area as described above.

When an execution of the processes at steps S413 and S415 is completed, the defect detecting section 111 can be configured to determine whether a defective cell has been detected (step S416). In this process, when it is determined that the defective cell has been detected ("Yes" at step S416), the storage processing section 112 can be configured to write defect information on the detected defective cell into the defect information management table 122 to update the defect information management table (step S417) and can be further configured to acquire the defect information stored in the updated defect information management table 122 (step S418).

Then, the defect number judging section 114 can be configured to calculate the number of defective cells included in the DIMM 12 based on the number of pieces of defect information stored in the defect information management table 122 (step S419).

When execution of the process at step S419 is completed, or a defective cell is not detected at step S416 ("No" at step S416), the defect number judging section 114 can be configured to determine whether an end of the electrical test of the DIMM 12 has been instructed (step S420). In this process, when the end of the electric test is not instructed ("No" at step S420), the defect number judging section 114 can be configured to return the process to step S411. On the other hand, when it is determined that the end of the electrical test has been instructed ("Yes" at step S420), the defect number judging section 114 can be configured to make the process proceed to step S421.

At step S421, the defect number judging section 114 can be configured to determine whether the number of defective cells calculated at step S419 is smaller than a standard value. The standard value can be a predetermined defective cell number which has been set in advance.

In the process at step S421, when it is determined that the number of defective cells is smaller than the standard value ("No" at step S421), the mode switching section 115 can be configured to switch the mode from the currently active test mode to the normal operation mode (step S422) and can be further configured to make the process proceed to step S423.

At step S423, the data writing/reading section 113 can be configured to write the test data into the defective cell detected at step S416. In this situation, since the mode has been already switched to the normal operation mode at step S422, the data writing/reading section 113 can be configured to write the test data into the defective cell and can be further configured to perform a process of putting the test data into an alternative area. As a result, the data, whose writing into the defective cell has been instructed, can be written into a memory cell (an alternative area) other than the defective cell.

Next, the defect detecting section 111 can be configured to read the test data written at step S423 (step S424) and can be further configured to write the data that has been written into the defective cell into the alternative area (step S425). Then, the storage processing section 112 can be configured to set the memory cell, that has stored the read-out test data, as the alternative area corresponding to the defective cell into which the test data has been instructed to be written, and can be further configured to store information on the memory cell in the defect information management table 122 (step S426). When a defective cell is included in a DIMM 12 on which the process at step S426 has been performed, the DIMM 12 can be subjected to a repairing process by writing the data, whose writing into the defective cell has been instructed, into its alternative area.

On the other hand, at step S421, when the number of the defective cells is not smaller than the standard value ("No" at step S421), the memory control device 11 can be configured to perform error notification that the DIMM 12, which has been tested, is a defective DIMM, and therefore should not be shipped (step S427). In this situation, since the repairing process is not performed on the defective DIMM, examination of the fundamental causes and improvement may be performed on the defective DIMM. When it has been determined that the number of defective cell is smaller than the standard value in a later conducted re-inspection, the DIMM can be put back on the market as a user-oriented device.

When an execution of the processes at steps S426 and S427 is completed, the memory control device 11 can be configured to terminate the test mode processing. In this embodiment, when a redundant area is present in the storage areas in the DRAMs 120a to 120d, the data, whose writing into the defective cell has been instructed, can be written into the redundant area. As previously described for an embodiment of the invention, the processes at steps S303 to S307, as illustrated in FIG. 6A, can be executed before execution of the process at step S403, as illustrated in FIG. 8A.

In addition, although, in this embodiment, whether the number of defective cells is larger or smaller than the standard value can be determined per DIMM, or can be performed, for example, per DRAM. Furthermore, although, in this embodiment, a determination can be made whether the number of defective cells included in the DIMM 12 is smaller than the standard value, the determination is not limited thereto and therefore a determination of whether the ratio of the defective cells included in the DIMM 12 is smaller than a standard value may be made.

As described above, in an embodiment of the invention, the test mode can be prepared in addition to the normal operation mode. A determination of whether the number of defective cells is smaller than the standard value can be made using the defect number judging section 114 in the test mode. Owing to the previously described operation, it may become possible to decide whether a repairing process is to be performed on a DIMM including defective cells based on a result of the determination performed using the defect number judging section 114. However, for a defective DIMM including the defective cells of the number larger than the standard value it may become impossible to perform the repairing process. As a result, examination of the fundamental causes and improvement may be performed on the defective DIMM and the defective DIMM, which has been reduced in the number of defective cells to a value smaller than the standard value by the repairing process, may be circulated to the market place, and hence a reduction in production yield may be prevented.

In addition, as for a DIMM 12 including a ratio of defective cells included in its storage areas that is smaller than the standard value, switching to the normal operation mode can be automatically performed using the mode switching section 115, and hence the DIMM 12, which has passed the electrical test, can be brought into a more suitable state for actual shipment.

In addition, the process of putting the data written into the defective cell into the alternative area can be executed using the data writing/reading section 113 by switching to the normal operation mode. Thus, after the mode has been switched to the normal operation mode, the test data can be written into the defective cell, the written test data can be read out and the read-out test data can be written into a normal cell using the data writing/reading section 113. The normal cell, into which the test data has been written, can be set as an alternative area corresponding to the defective cell into which the test data has been once written and information on the normal cell can be stored in the defect information management table 122 to be related to defect information on the defective cell concerned using the storage processing unit. The time taken for execution of the repairing process can be reduced by establishing a state in which each alternative area can be prepared in advance corresponding to each defective cell before execution of the repairing process on each defective cell as mentioned above.

Although several embodiments of the invention have been described in detail on the basis of the accompanying drawings, these embodiments are merely examples and the invention may be implemented in other forms which are altered and modified in a variety of ways on the basis of knowledge of a person skilled in the art.

Figure 9A:
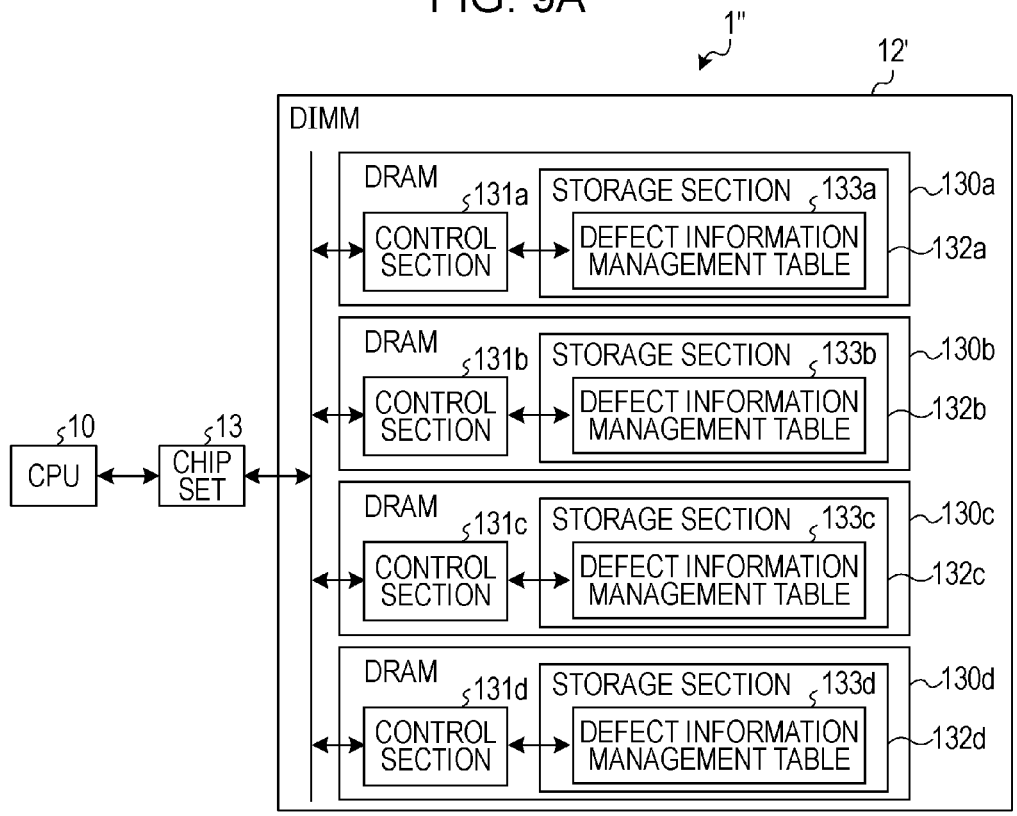
FIG. 9A is a block diagram illustrating another example of the configuration of the information processing apparatus in accordance with an embodiment of the invention.

For example, a control section may be installed in each DRAM. FIG. 9A illustrates another example of the configuration of the information processing apparatus. The same numerals are assigned to the same constitutional elements as those which have already been described, and hence description thereof will be omitted.

As illustrated in FIG. 9A, an information processing apparatus 1", altered or modified as described above, can include the CPU 10, the chip set 13, and a DIMM 12'. The DIMM 12' can include a plurality of DRAMs 130a to 130d.

The DRAMs 130a to 130d can respectively include control sections 131a to 131d and storage sections 132a to 132d. Each of the control sections 131a to 131d corresponds to the memory control device in each of the previously described embodiments and can have the defect detecting section 111, the storage processing section 112, the data writing/reading section 113, the defect number judging section 114, and the mode switching section 115. The storage sections 132a to 132d can include nonvolatile storage areas and can respectively be configured to store defect information management tables 133a to 133d. Each of the defect information management tables 133a to 133d can be configured to store only defect information relating to a defective cell in a self DRAM. The chip set 13 can be a memory interface connected to the DIMM 12' and can be configured to instruct the control sections 131a to 131d of the DRAMs 130a to 130d to write data into the DIMM 12' and to read data out of the DIMM 12' in accordance with the instruction from the CPU 10.

Thus, in the previously described arrangement, since each of the control sections 131a to 131d of the DRAMs 130a to 130d can be configured to control only the access to the self DRAM using each of the defect information management tables 133a to 133d that store defect information relating to defective cells in the respective DRAMs, the processing speed of the entire information processing apparatus 1" can be increased.

As described above, each of the DRAMs 130a to 130d can correspond to a storage device including a defect detecting unit detecting a defective cell included in memory cells, a storage processing unit storing defect information including address information of the defective cell detected using the defect detecting unit in a predetermined storage area, and a data writing unit writing data, whose writing into the defective cell has been executed into a storage area other than the defective cell based on the defect information stored using the storage processing unit.

In addition, the DIMM can be configured to function as the memory control device described in each of the previously described embodiments by providing a control section in the DIMM.

Figure 9B:
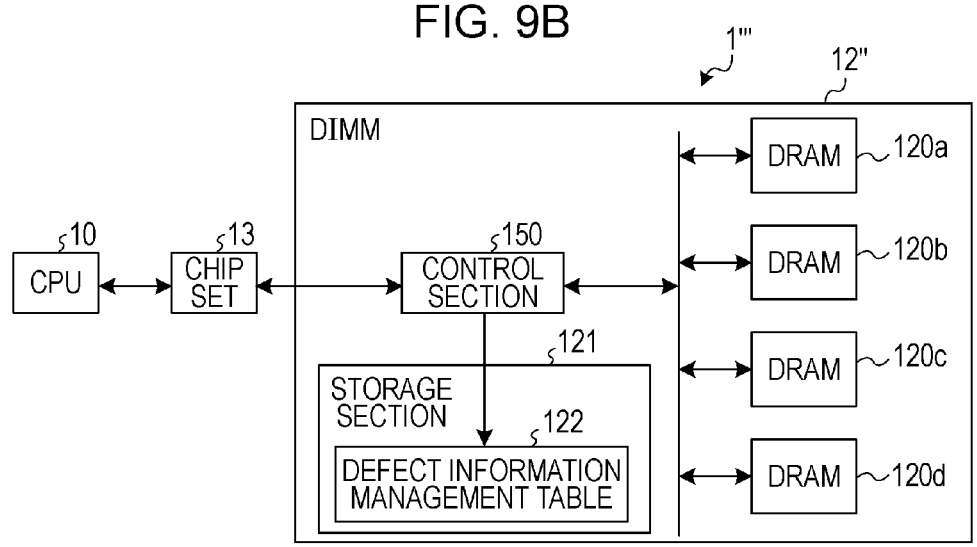
FIG. 9B is a block diagram illustrating a further example of the configuration of the information processing apparatus in accordance with an embodiment of the invention.

FIG. 9B illustrates a further example of the configuration of the information processing apparatus in accordance with an embodiment of the invention. The same numerals are assigned to the same constitutional elements as those which have already been described, and hence description thereof will be omitted.

As illustrated in FIG. 9B, an information processing apparatus 1''', altered or modified as described above, can include the CPU 10, the chip set 13, and a DIMM 12". The DIMM 12" can include the plurality of DRAMs 120a to 120d, the storage section 121 configured to store the defect information management table 122, and the control section 150. The control section 150 can correspond to a memory control device and can include the defect detecting section 111, the storage processing section 112, the data writing/reading section 113, the defect number judging section 114, and the mode switching section 115. As described above, the memory control device disclosed can also be applied to a DRAM and a DIMM.

Figure 9C:
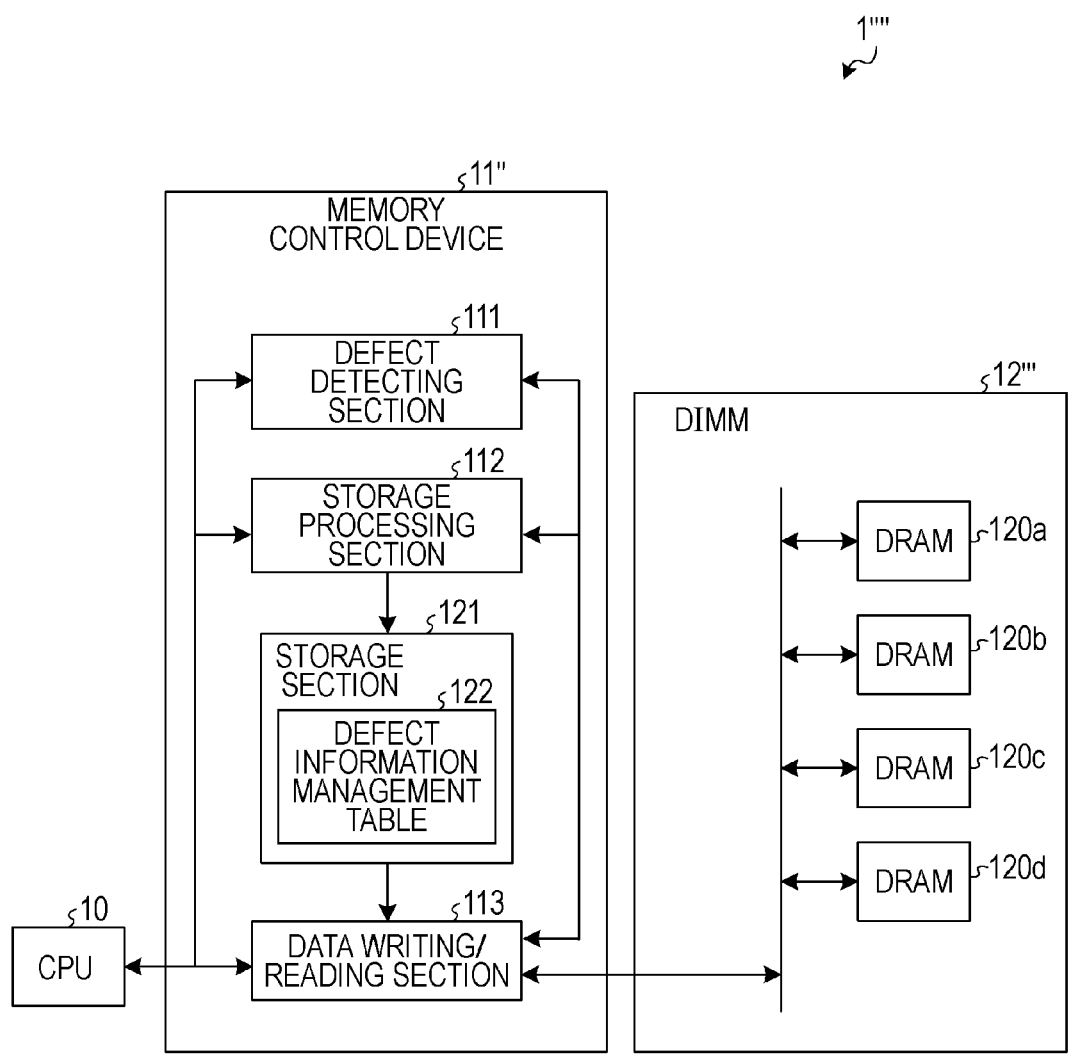
FIG. 9C is a block diagram illustrating a still further example of the configuration of the information processing in accordance with an embodiment of the invention.
Figure 10A:
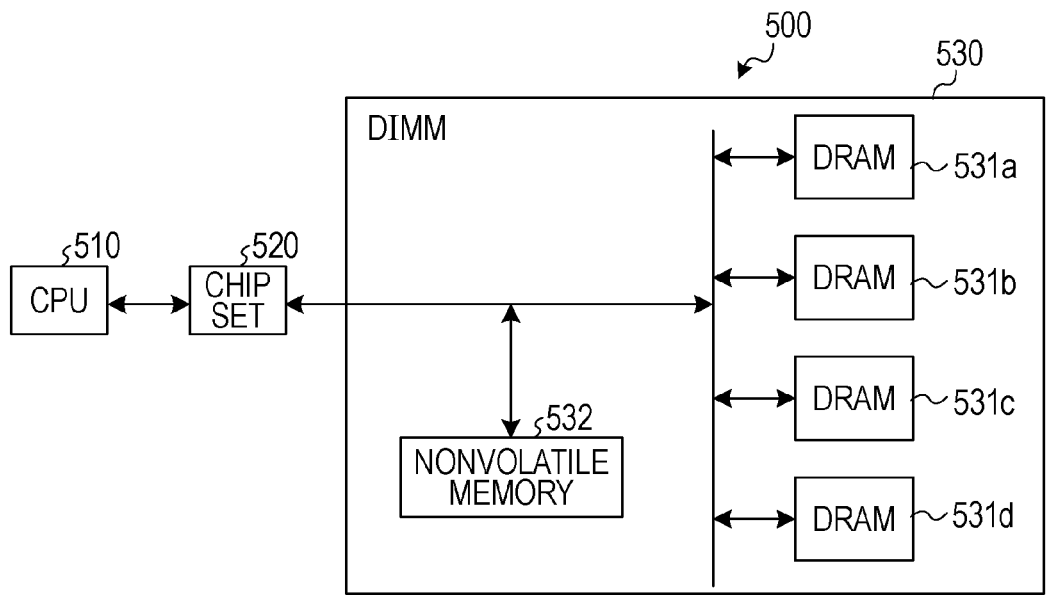
FIG. 10A is a block diagram illustrating an example of a configuration of an information processing apparatus.
Figure 10B:
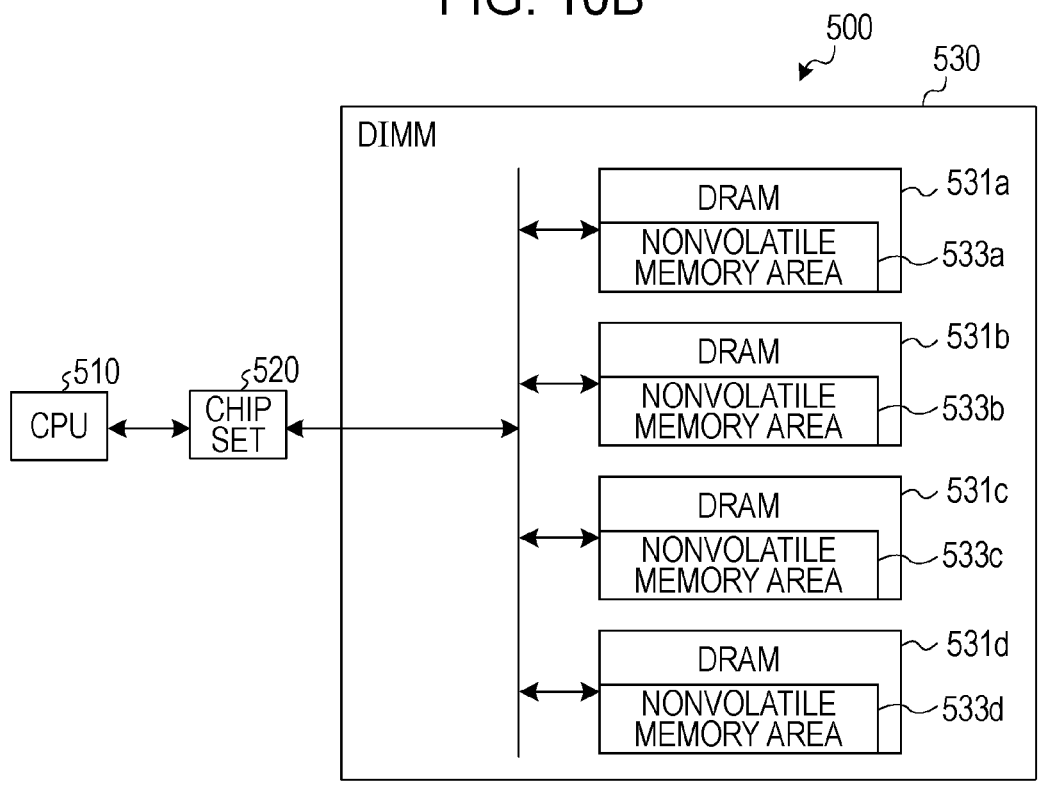
FIG. 10B is a block diagram illustrating another example of the configuration of the information processing apparatus.
Figure 11:
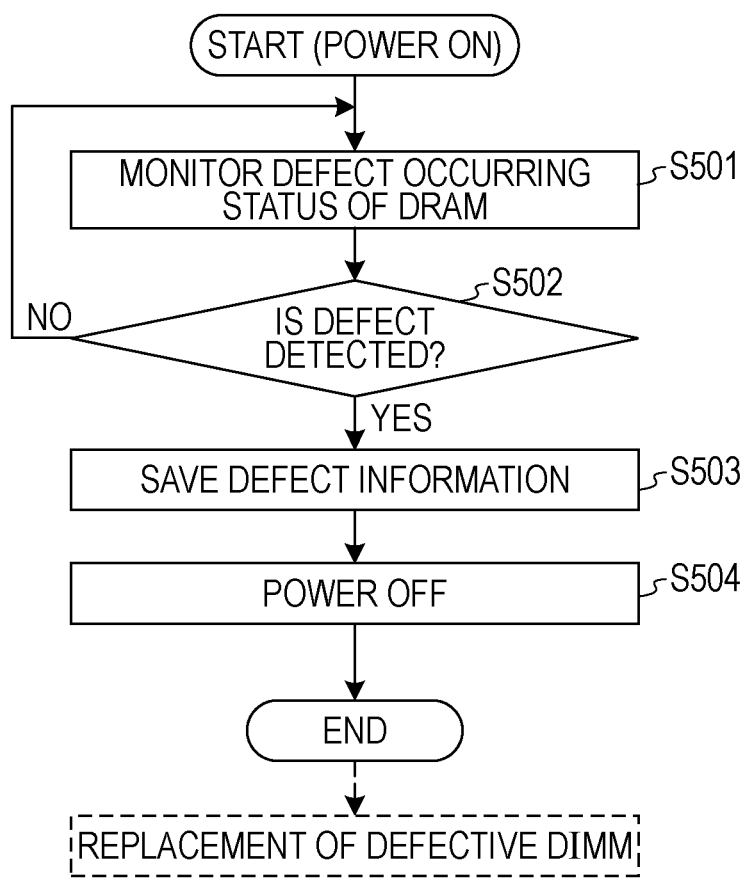
FIG. 11 is a flowchart illustrating an example of a process performed upon occurrence of a memory error.
Figure 12:
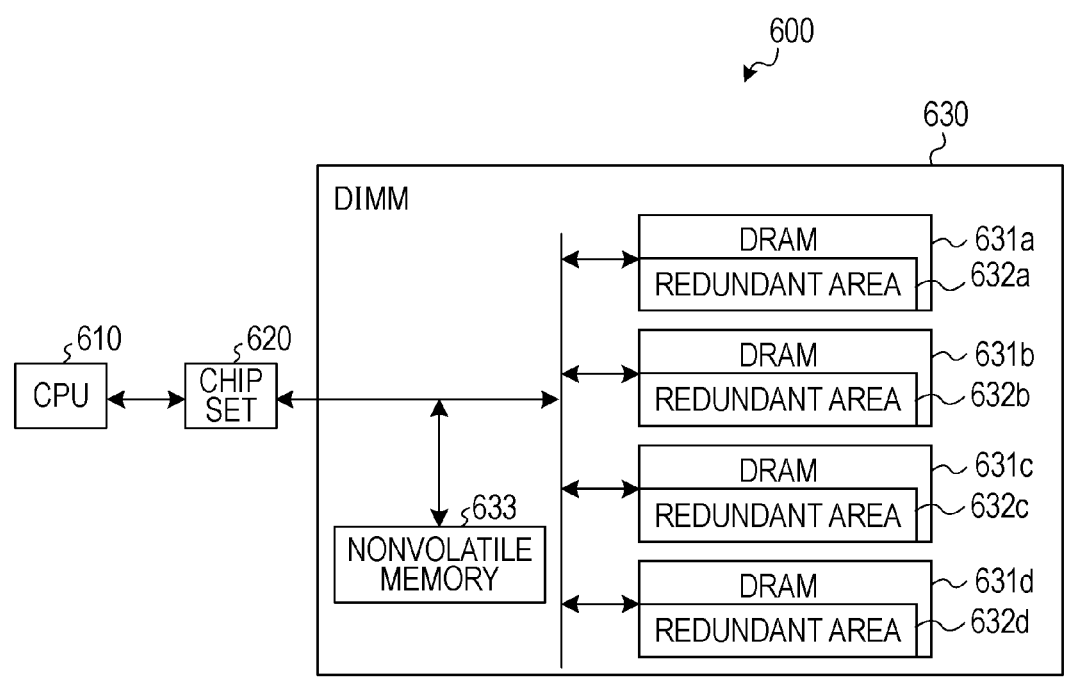
FIG. 12 is a block diagram illustrating a further example of the configuration of the information processing apparatus.
Figure 13A:
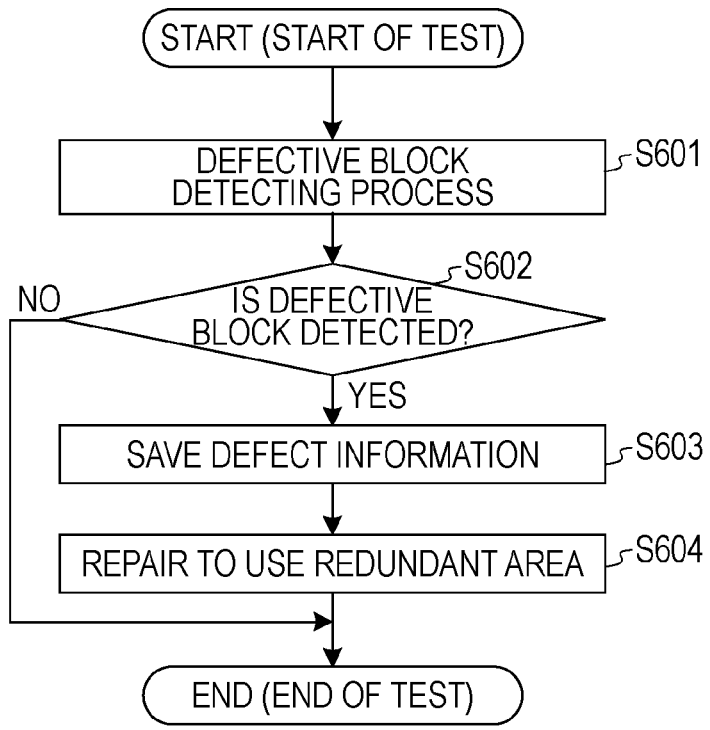
FIG. 13A is a flowchart illustrating an example of a process performed when a memory error has been detected in an electrical test.
Figure 13B:
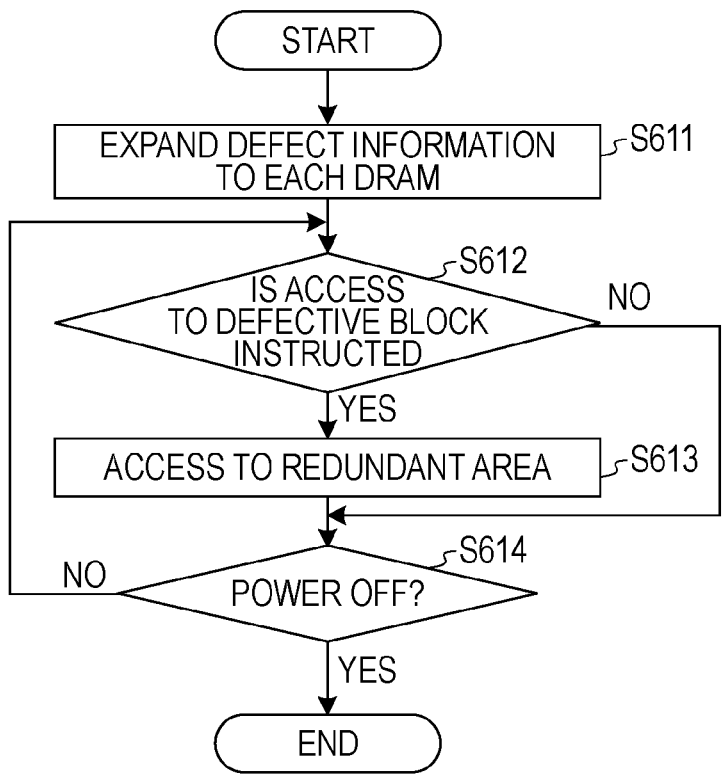
FIG. 13B is a flowchart illustrating an example of a process performed when access to a defective block has been instructed.

In addition, the storage section 121 can be installed in the memory control device 11. FIG. 9C illustrates a further example of the configuration of the information processing apparatus in accordance with an embodiment of the invention. The same numerals are assigned to the same constitutional elements as those which have already been described, and hence description thereof will be omitted.

As illustrated in FIG. 9c, an information processing apparatus 1''', altered or modified as described above, can include the CPU 10, a memory control device 11'' and a DIMM 12'''. The memory control device 11'' can include the defect detecting section 111, the storage processing section 112, the data writing/reading section 113, and the storage section 121. The storage section 121 can correspond to a defect information storing unit and can include the defect information management table 122 configured to store defect information on a defective cell that has been detected using the defect detecting section 111. The DIMM 12''' can include the plurality of DRAMs 120a to 120d.

As described above, owing to the provision of the storage section 121 in the memory control device 11'', when the defect information on the defective cell that has been detected using the defect detecting section 111 is to be stored in the defect information management table 122, it may not be necessary for the storage processing section 112 to gain access to the DIMM 12''', and hence the process may be efficiently performed.

In addition, although in the previously described embodiments, detection of a defective cell can be performed with respect to an area, into which data writing has been instructed, embodiments of the invention are not limited thereto and can be configured not to perform the data writing process and the data reading process as mentioned above on a memory cell that has already been identified as a defective cell, for example, based on acquired defect information in the defect information management table 122 (for example, the process at step S102 in FIG. 3A), when the power source of the image processing apparatus is turned on.

As a result, a process of performing judgment on a memory cell that is clearly identified as a defective cell as to whether it is a defective cell may be eliminated. When the test mode is prepared as described for the embodiment illustrated in at least one of FIGS. 7, 8A-8B, and 9A-9C, a determination can be made whether the defect information acquired when the power source is turned on is used based on a mode set. For example, in the test mode, the determination as to whether a memory cell is a defective cell can be performed on all the memory cells with no use of the defect information acquired when the power source is turned on.

Further, although in each of the above mentioned embodiments, respective pieces of defect information on the respective DRAMs 120a to 120d are gathered together and stored as a set in the storage section 121 of the DIMM 12, nonvolatile storage areas can be installed in the DRAMs 120a to 120d to store respective pieces of defect information discretely in the storage areas concerned.

All examples and conditional language recited herein are intended for pedagogical objects to aid the reader in understanding the invention and the concepts contributed by the inventors to further the art, and are to be construed as being without limitation to such specifically recited examples and conditions, nor does the organization of such examples in the specification relate to a showing of the superiority and inferiority of the invention. Although the embodiments of the invention have been described in detail, it will be understood by those of ordinary skill in the relevant art that various changes, substitutions, and alterations could be made hereto without departing from the spirit and scope of the invention as set forth in the claims.

What is claimed is:

1. A memory control device configured to control access to a storage device comprising a plurality of storage areas, the memory control device comprising:
   a defect detecting unit configured to detect a defective area of a storage area into which data may not be stored;
   a storage processing unit configured to store defect information comprising address information of the defective area detected using the defect detecting unit into a memory area;
   a data writing unit configured to write data, which has been written into the defective area, into a storage area other than the storage area comprising the defective area based on the defect information stored using the storage processing unit; and
   a defect number judging unit configured to determine whether a ratio of the defective area included in the storage area, which has been detected using the defect detecting unit, is lower than a predetermined ratio.

2. The memory control device according to claim 1, wherein the defect detecting unit is further configured to write data into the storage device, and further configured to read out the written data to specify the defective area of the storage device based on a difference between the written data and read-out data.

3. The memory control device according to claim 1, wherein the data writing unit is further configured to write the data into the storage area that has been designated in advance as an alternative area to the defective area into which the data is written in place of the defective area.

4. The memory control device according to claim 3, wherein the data writing unit is further configured to designate an alternative area of a set capacity from within space areas present in the storage areas and further configured to write the data into the designated alternative area when the alternative area to the defective area is not present.

5. The memory control device according to claim 1, wherein the memory control device comprises a normal operation mode for executing a process of writing data into the storage area other than the defective area when the data has been written into the defective area, and further comprises a test mode where no data is written into the storage area other than the defective area even when the data has been written into the defective area.

6. The memory control device according to claim 5, further comprising: a mode switching unit configured to switch an operation mode of the memory control device from the test mode to the normal operation mode when the defect number judging unit has determined that a number of defective areas is smaller than a predetermined number.

7. The memory control device according to claim 6, wherein the data writing unit is further configured to write test data, which has been written into the defective area, into the storage area other than the defective area after mode switching has been performed using the mode switching unit when the defect number judging unit has determined that the number of defective areas is smaller than the predetermined number that has been set in advance.

8. The memory control device according to claim 7, wherein the storage processing unit is further configured to store information comprising address information of the storage area other than the defective area into which the test data has been written in the memory area to be related to defect information of the defective area.

9. The memory control device according to claim 1, further comprising: a defect information storage unit configured to store the defect information comprising the address information of the defective area that has been detected using the defect detecting unit.

10. A memory module comprising:
a storage device comprising a plurality of storage areas configured to store data; and a memory control device configured to control access to the storage device, wherein the memory control device comprises: a defect detecting unit configured to detect a defective area of a storage area into which data may not be stored;
a storage processing unit configured to store defect information comprising address information of the defective area detected using the defect detecting unit into a memory area;
a data writing unit configured to write data, which has been written into the defective area, into a storage area other than the storage area comprising the defective area based on the defect information stored using the storage processing unit; and
a defect number judging unit configured to determine whether a ratio of the defective area included in the storage area, which has been detected using the defect detecting unit, is lower than a predetermined ratio.

11. A storage device comprising a plurality of storage areas, the storage device comprising:
a defect detecting unit configured to detect a defective area of a storage area into which data may not be stored;
a storage processing unit configured to store defect information comprising address information of the defective area detected using the defect detecting unit into a memory area;
a data writing unit configured to write data, which has been written into the defective area, into a storage area other than the storage area comprising the defective area based on the defect information stored using the storage processing unit; and
a defect number judging unit configured to determine whether a ratio of the defective area included in the storage area, which has been detected using the defect detecting unit, is lower than a predetermined ratio.

12. A memory controlling method for controlling access to a storage device comprising a plurality of storage areas, the memory controlling method comprising:
detecting a defective area of a storage area that data may not be stored;
storing defect information comprising address information of the detected defective area in a memory area;
writing data, which has been written into the defective area, into a storage area other than the storage area comprising the defective area based on the defect information which has been stored; and
determining whether a ratio of the defective area included in the storage area, which has been detected using the defect detecting unit, is lower than a predetermined ratio.

13. The memory controlling method according to claim 12, further comprising: writing data into the storage device; and reading out the written data to specify the defective area of the storage device based on a difference between the written data and read-out data.

14. The memory controlling method according to claim 12, wherein the writing comprises writing the data into the storage area that has been designated in advance as an alternative area to the defective area into which the data is written in place of the defective area.

15. The memory controlling method according to claim 14, further comprising: designating an alternative area of a set capacity from within space areas present in the storage areas; and writing the data into the designated alternative area when the alternative area to the defective area is not present.

16. The memory control method according to claim 12, further comprising: switching an operation mode of the memory control device from a test mode to a normal operation mode when it has been determined that a number of defective areas is smaller than a predetermined number, wherein, in the normal operation mode, the memory control device is configured to execute a process of writing the data into a storage area other than the defective area when the data has been written into the defective area, and wherein, in the test mode, no data is written into the storage area other than the defective area even when the data has been written into the defective area.

17. The memory control method according to claim 16, further comprising: writing test data, which has been written into the defective area, into the storage area other than the defective area after mode switching has been performed when the determination has been made that the number of defective areas is smaller than the predetermined number that has been set in advance.

18. The memory control method according to claim 17, further comprising: storing information comprising address information of the storage area other than the defective area into which the test data has been written in the memory area to be related to defect information of the defective area.

* * * * *